United States Patent [19]
Halpin et al.

[11] Patent Number: 6,113,702
[45] Date of Patent: Sep. 5, 2000

[54] WAFER SUPPORT SYSTEM

[75] Inventors: Michael W. Halpin, Phoenix; Mark R. Hawkins, Gilbert; Derrick W. Foster, Scottsdale; Robert M. Vyne, Gilbert, all of Ariz.; John F. Wengert, Jacksonville; Cornelius A. van der Jeugd, Portland, both of Oreg.; Loren R. Jacobs, Mesa, Ariz.; Frank B. M. Van Bilsen, Phoenix, Ariz.; Matthew Goodman, Tempe, Ariz.; Hartmann Glenn, Phoenix, Ariz.; Jason M. Layton, Chandler, Ariz.

[73] Assignee: ASM America, Inc., Phoenix, Ariz.

[21] Appl. No.: 08/923,241

[22] Filed: Sep. 4, 1997

Related U.S. Application Data

[63] Continuation-in-part of application No. 08/788,817, Jan. 23, 1997, which is a continuation-in-part of application No. 08/706,069, Aug. 30, 1996, abandoned.
[60] Provisional application No. 60/039,850, Mar. 5, 1997, and provisional application No. 60/003,132, Sep. 1, 1995.

[51] Int. Cl.[7] .................................................. C23C 16/00
[52] U.S. Cl. ..................... 118/725; 118/715; 118/728; 118/730; 118/500; 156/345
[58] Field of Search ................................... 118/715, 725, 118/728, 730, 500; 156/345

[56] References Cited

U.S. PATENT DOCUMENTS

| | | |
|---|---|---|
| 3,627,590 | 12/1971 | Mammel . |
| 4,261,762 | 4/1981 | King . |
| 4,313,783 | 2/1982 | Davies et al. . |
| 4,403,567 | 9/1983 | daCosta et al. . |
| 4,457,359 | 7/1984 | Holden . |
| 4,458,746 | 7/1984 | Holden et al. . |
| 4,508,161 | 4/1985 | Holden . |
| 4,512,391 | 4/1985 | Harra . |
| 4,522,697 | 6/1985 | Dimock et al. . |
| 4,523,985 | 6/1985 | Dimock . |
| 4,527,620 | 7/1985 | Pedersen et al. . |

(List continued on next page.)

FOREIGN PATENT DOCUMENTS

| | | |
|---|---|---|
| 0 448 346 A1 | 9/1991 | European Pat. Off. . |
| 0452779A2 | 10/1991 | European Pat. Off. . |
| 0 592 017 A2 | 4/1994 | European Pat. Off. . |
| 0 651 424 A2 | 5/1995 | European Pat. Off. . |
| 0657918A2 | 6/1995 | European Pat. Off. . |
| 2181458A | of 0000 | United Kingdom . |

*Primary Examiner*—Jeffrie R Lund
*Attorney, Agent, or Firm*—Knobbe, Martens, Olson & Bear, LLP

[57] ABSTRACT

A wafer support system comprising a segmented susceptor having top and bottom sections and gas flow passages therethrough. A plurality of spacers projecting from a recess formed in the top section of the susceptor support a wafer in spaced relationship with respect to the recess. A sweep gas is introduced to the bottom section of the segmented susceptor and travels through the gas flow passages to exit in at least one circular array of outlets in the recess and underneath the spaced wafer. The sweep gas travels radially outward between the susceptor and wafer to prevent backside contamination of the wafer. The gas is delivered through a hollow drive shaft and into a multi-armed susceptor support underneath the susceptor. The support arms conduct the sweep gas from the drive shaft to the gas passages in the segmented susceptor. The gas passages are arranged to heat the sweep gas prior to delivery underneath the wafer. Short purge channels may be provided to deliver some of the sweep gas to regions surrounding the spacers to cause a continuous flow of protective purge gas around the spacers. A common bottom section may cooperate with a plurality of different top sections to form segmented susceptors suitable for supporting various sized wafers.

29 Claims, 25 Drawing Sheets

U.S. PATENT DOCUMENTS

| | | | |
|---|---|---|---|
| 4,535,834 | 8/1985 | Turner . | |
| 4,535,835 | 8/1985 | Holden . | |
| 4,537,244 | 8/1985 | Holden . | |
| 4,542,298 | 9/1985 | Holden . | |
| 4,565,601 | 1/1986 | Kakehi et al. . | |
| 4,567,938 | 2/1986 | Turner . | |
| 4,603,466 | 8/1986 | Morley . | |
| 4,654,509 | 3/1987 | Robinson et al. . | |
| 4,709,655 | 12/1987 | Van Mastrigt . | |
| 4,724,621 | 2/1988 | Hobson et al. . | |
| 4,789,771 | 12/1988 | Robinson et al. | 219/405 |
| 4,790,262 | 12/1988 | Nakayama et al. . | |
| 4,860,687 | 8/1989 | Frijlink . | |
| 4,911,812 | 3/1990 | Kudo et al. . | |
| 4,923,584 | 5/1990 | Bramhall, Jr. et al. . | |
| 4,949,783 | 8/1990 | Lakios et al. . | |
| 4,958,061 | 9/1990 | Wakabayashi et al. . | |
| 5,027,746 | 7/1991 | Frijlink . | |
| 5,033,407 | 7/1991 | Mizuno et al. . | |
| 5,033,538 | 7/1991 | Wagner et al. . | |
| 5,090,900 | 2/1992 | Rudolf et al. . | |
| 5,096,536 | 3/1992 | Cathey, Jr. . | |
| 5,133,284 | 7/1992 | Thomas et al. . | |
| 5,148,714 | 9/1992 | McDiarmid | 74/89.15 |
| 5,155,062 | 10/1992 | Coleman . | |
| 5,156,820 | 10/1992 | Wong et al. . | |
| 5,160,544 | 11/1992 | Garg et al. . | |
| 5,180,000 | 1/1993 | Wagner et al. . | |
| 5,199,483 | 4/1993 | Bahng . | |
| 5,215,619 | 6/1993 | Cheng et al. . | |
| 5,221,403 | 6/1993 | Nozawa et al. . | |
| 5,230,741 | 7/1993 | van de Ven et al. . | |
| 5,238,499 | 8/1993 | van de Ven et al. . | |
| 5,248,370 | 9/1993 | Tsui et al. . | |
| 5,267,607 | 12/1993 | Wada . | |
| 5,287,914 | 2/1994 | Hughes . | |
| 5,290,381 | 3/1994 | Nozawa et al. . | |
| 5,292,393 | 3/1994 | Maydan et al. . | |
| 5,298,465 | 3/1994 | Levy . | |
| 5,308,645 | 5/1994 | Zachman et al. . | |
| 5,318,634 | 6/1994 | deBoer et al. . | |
| 5,320,982 | 6/1994 | Tsubone et al. . | |
| 5,322,565 | 6/1994 | Zachman et al. . | |
| 5,332,442 | 7/1994 | Kubodera et al. . | |
| 5,343,012 | 8/1994 | Hardy et al. . | |
| 5,343,938 | 9/1994 | Schmidt . | |
| 5,350,479 | 9/1994 | Collins et al. . | |
| 5,352,294 | 10/1994 | White et al. . | |
| 5,354,382 | 10/1994 | Sung et al. . | |
| 5,356,476 | 10/1994 | Foster et al. . | |
| 5,370,739 | 12/1994 | Foster et al. . | |
| 5,382,311 | 1/1995 | Ishikawa et al. . | |
| 5,383,971 | 1/1995 | Selbrede . | |
| 5,387,289 | 2/1995 | Schmitz et al. . | |
| 5,393,349 | 2/1995 | Ohkase . | |
| 5,403,401 | 4/1995 | Haafkens et al. . | |
| 5,445,677 | 8/1995 | Kawata et al. . | |
| 5,446,824 | 8/1995 | Moslehi . | |
| 5,456,757 | 10/1995 | Aruga et al. . | |
| 5,458,687 | 10/1995 | Shichida et al. . | |
| 5,462,603 | 10/1995 | Murakami . | |
| 5,467,220 | 11/1995 | Xu . | |
| 5,484,011 | 1/1996 | Tepman et al. | 165/1 |
| 5,522,131 | 6/1996 | Steger . | |
| 5,645,646 | 7/1997 | Beinglass et al. | 118/730 |
| 5,656,093 | 8/1997 | Burkhart et al. | 118/728 |
| 5,685,906 | 11/1997 | Dietze et al. | 117/101 |
| 5,738,165 | 4/1998 | Imai | 165/80.2 |

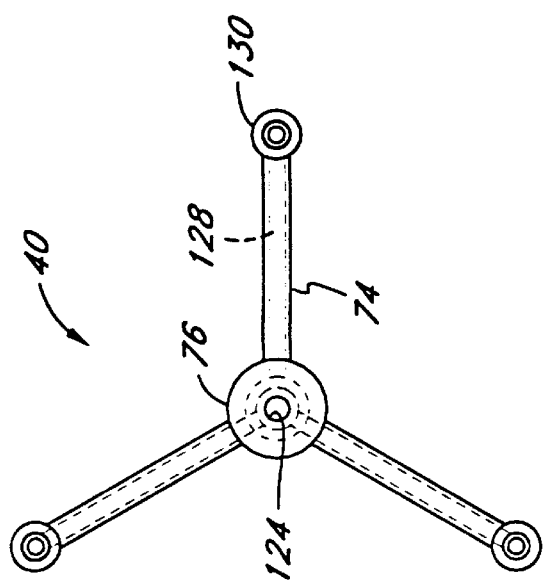
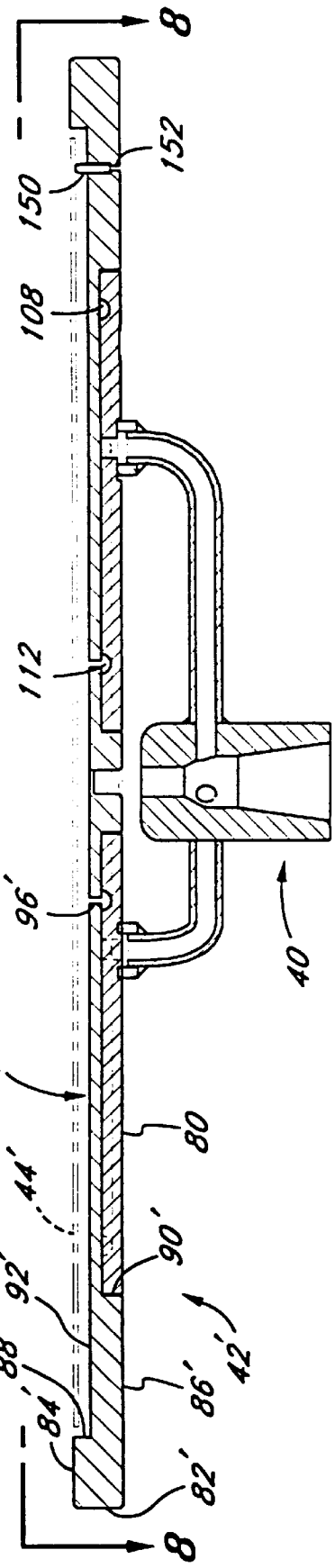

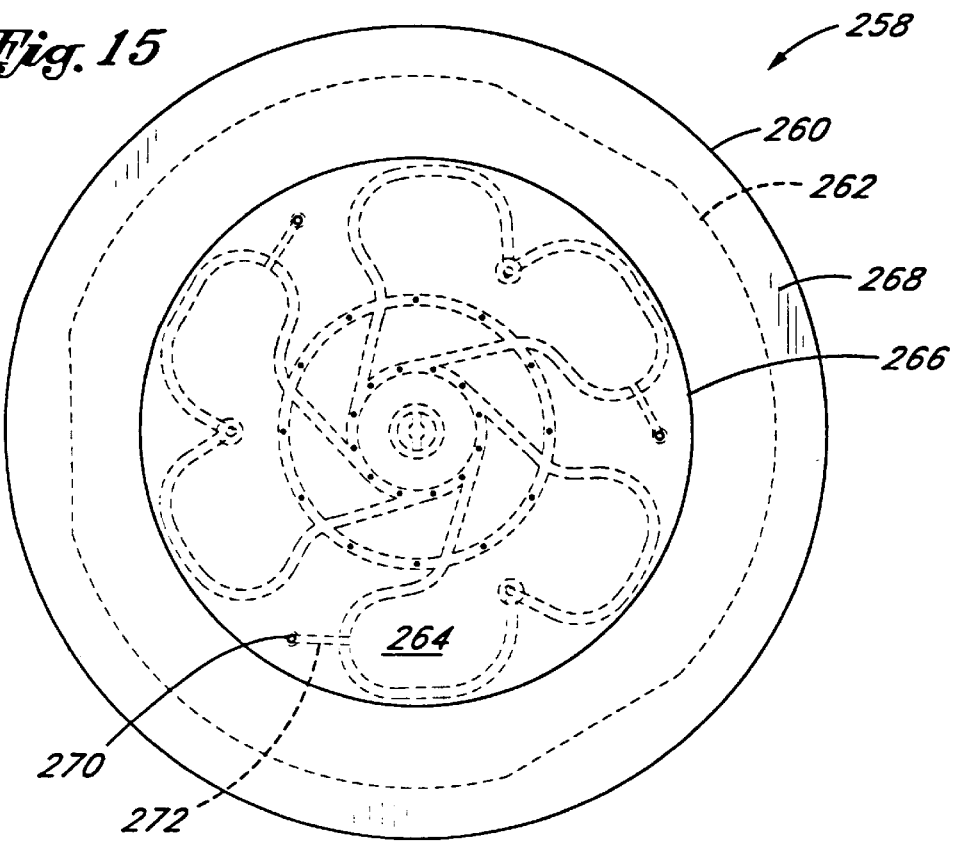
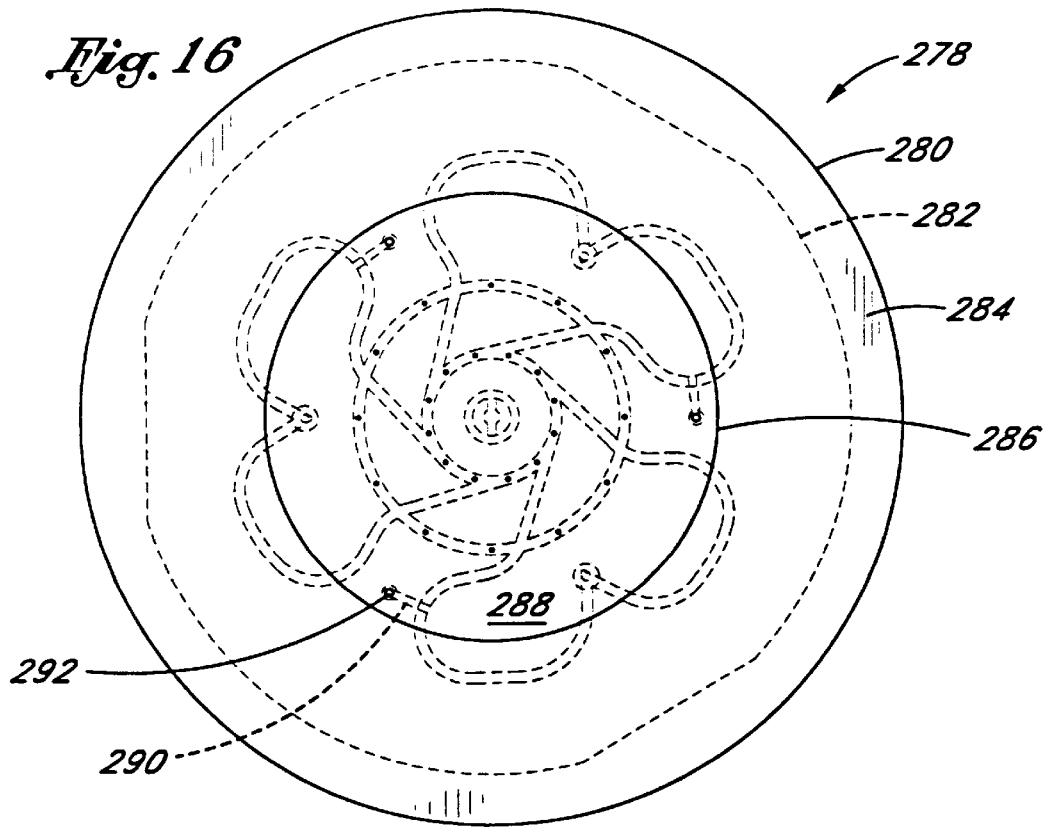

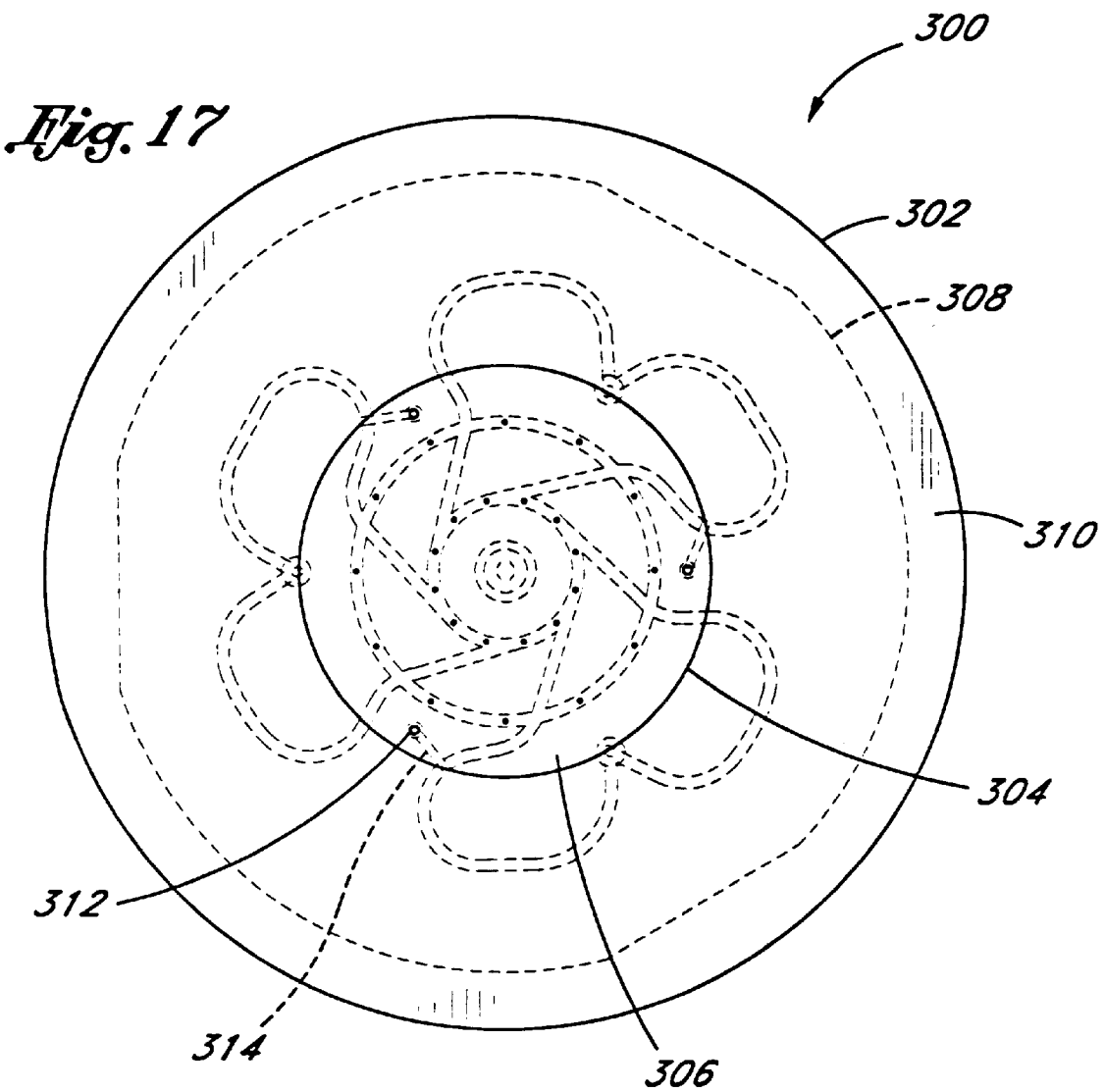

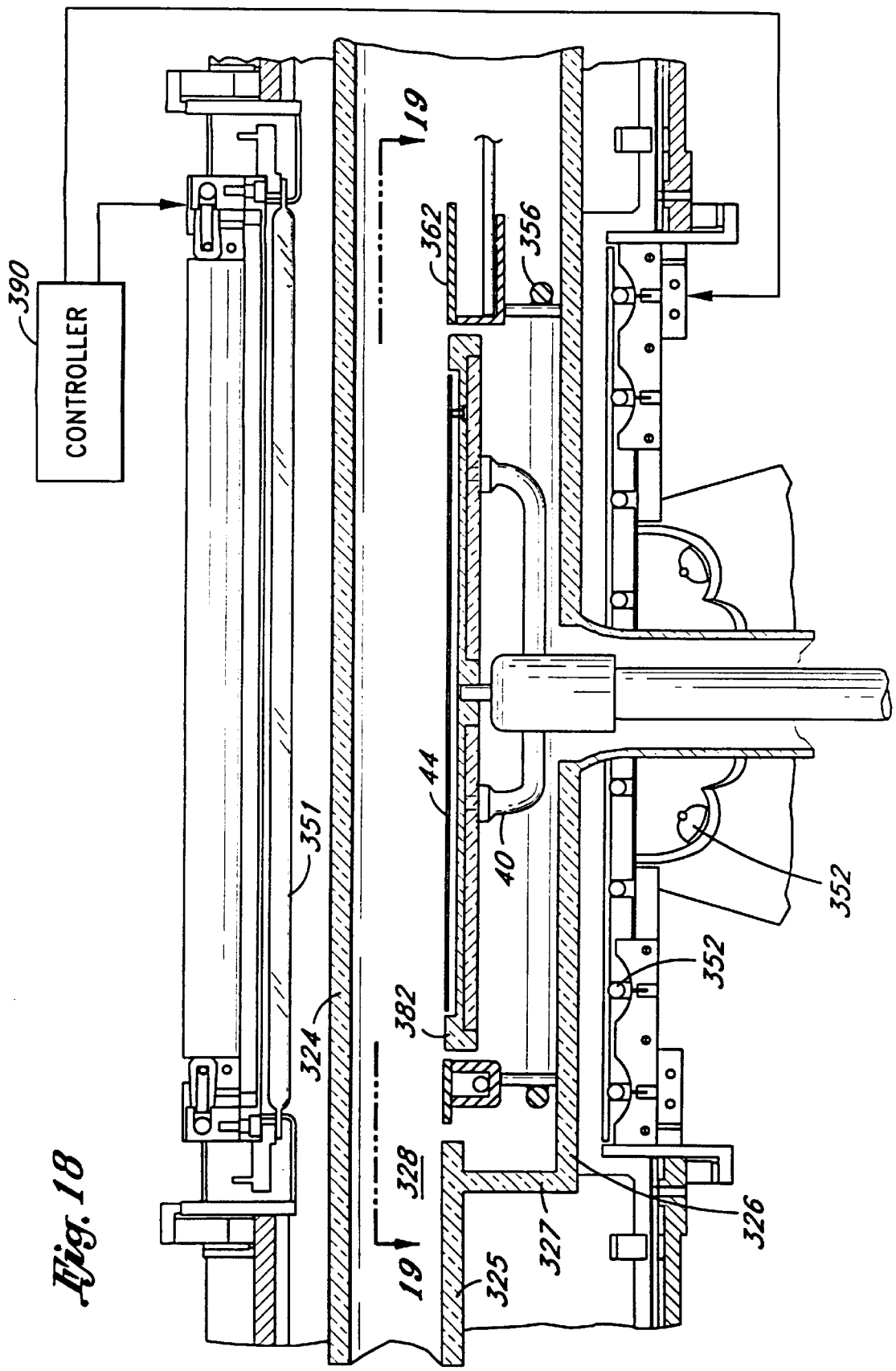

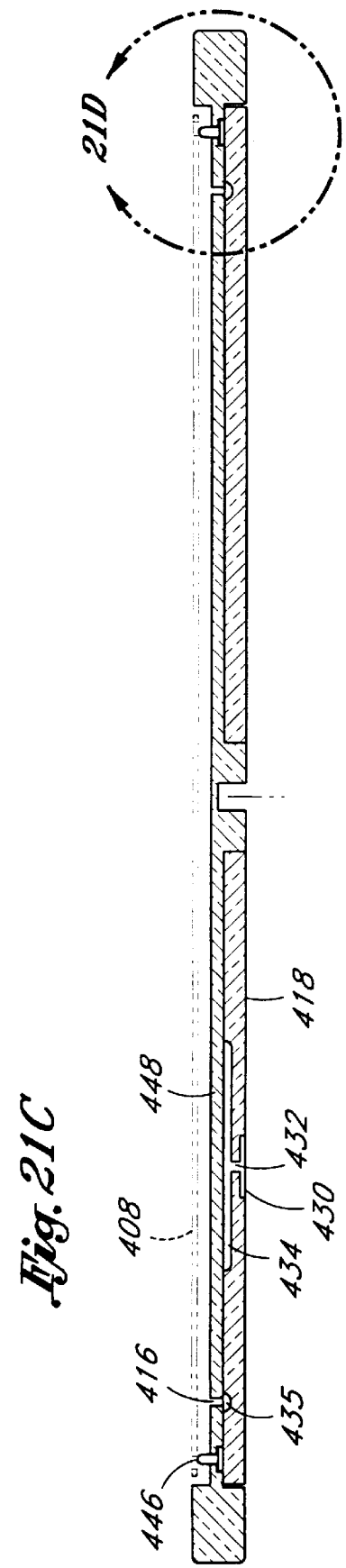

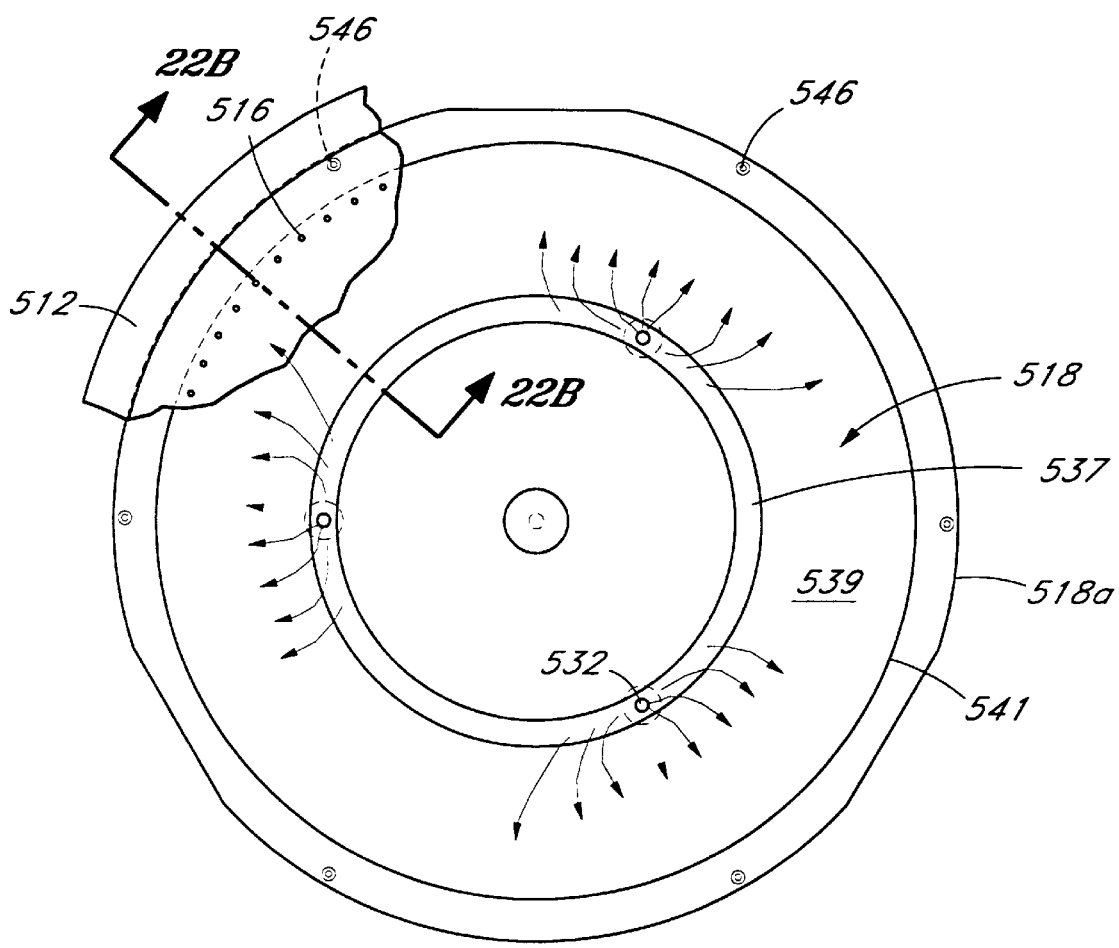

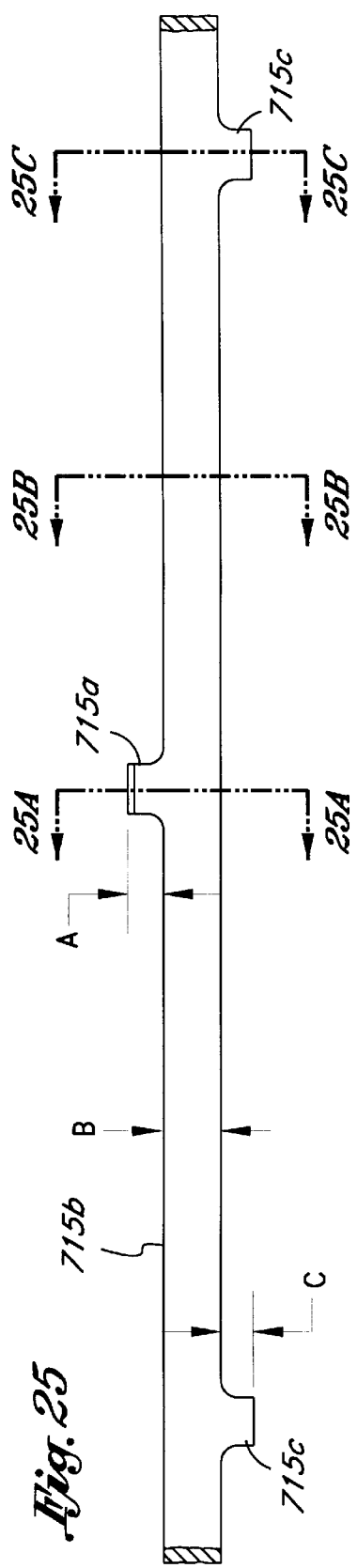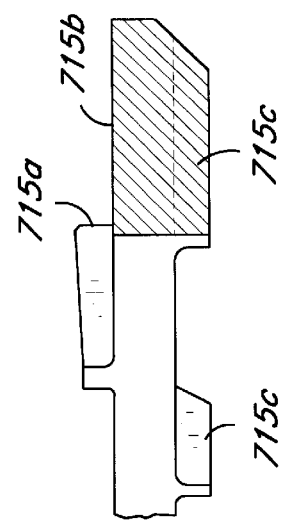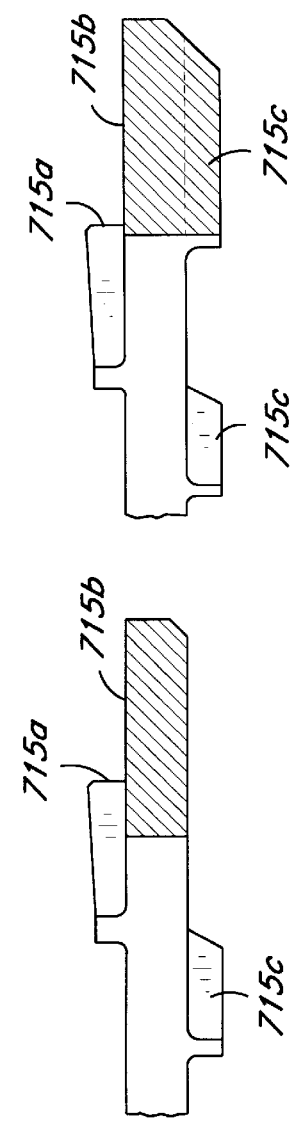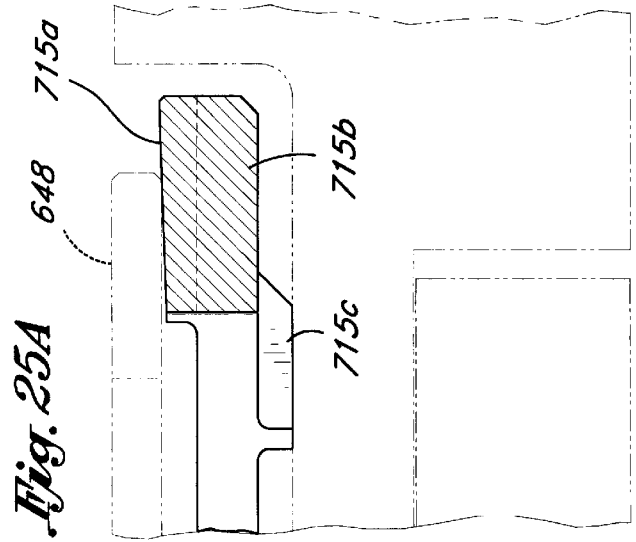

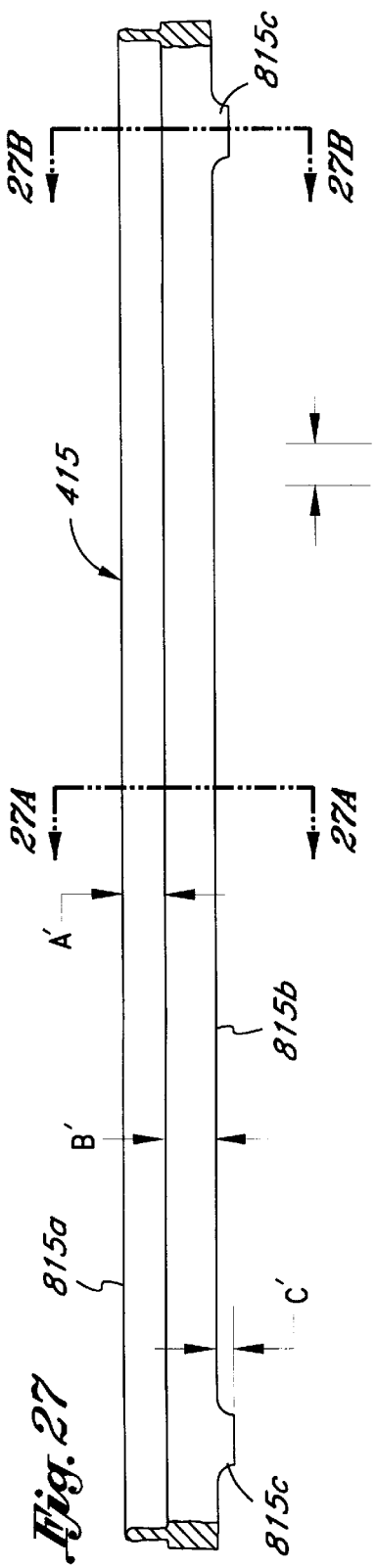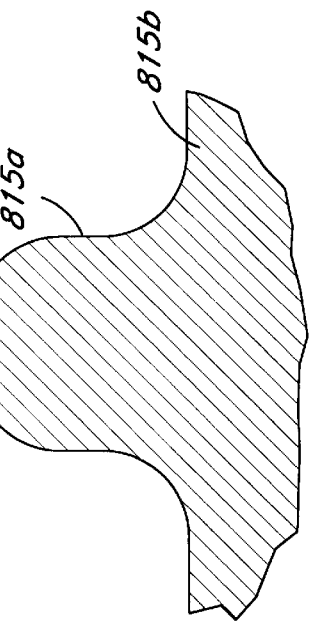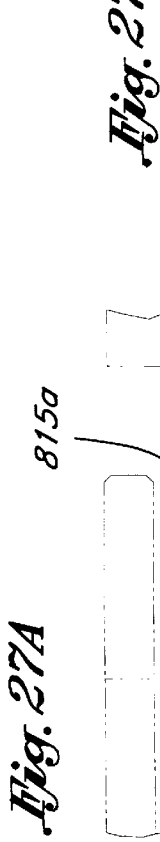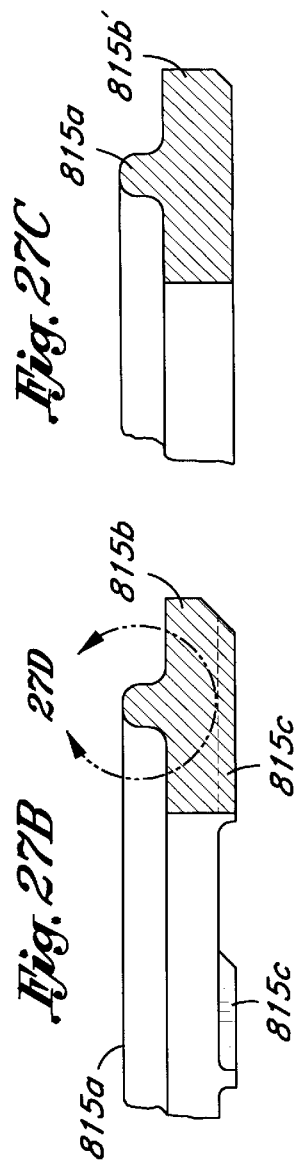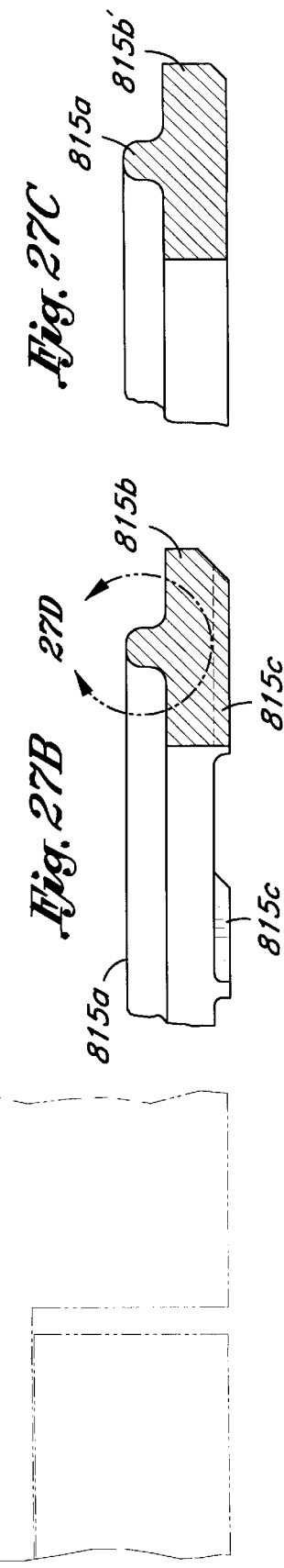

WAFER SUPPORT SYSTEM

RELATED APPLICATIONS

This application claims the priority benefit of Provisional application No. 60/039,850 filed Mar. 5, 1997 and is a continuation-in-part of application Ser. No. 08/788,817 filed Jan. 23, 1997, which is a continuation-in-part of application Ser. No. 08/706,069 filed Aug. 30, 1996, (now abandoned) which claims the priority benefit of Provisional Application No. 60/003,132, filed Sep. 1, 1995.

FIELD OF THE INVENTION

The present invention relates to supports for wafers in semiconductor processing chambers and, more particularly, to a system for supporting a wafer above a susceptor within a chemical vapor deposition chamber.

BACKGROUND OF THE INVENTION

High-temperature ovens, or reactors, are used to process semiconductor wafers from which integrated circuits are made for the electronics industry. A circular wafer or substrate, typically made of silicon, is placed on a wafer support called a susceptor. Both the wafer and susceptor are enclosed in a quartz chamber and heated to high temperatures, such as 600° C. (1112° F.) or higher, frequently by a plurality of radiant lamps placed around the quartz chamber. A reactant gas is passed over the heated wafer, causing the chemical vapor deposition (CVD) of a thin layer of the reactant material on the wafer. Through subsequent processes in other equipment, these layers are made into integrated circuits, with a single layer producing from tens to thousands of integrated circuits, depending on the size of the wafer and the complexity of the circuits.

If the deposited layer has the same crystallographic structure as the underlying silicon wafer, it is called an epitaxial layer. This is also sometimes called a monocrystalline layer because it has only one crystal structure.

Various CVD process parameters must be carefully controlled to ensure the high quality of the resulting semiconductor. One such critical parameter is the temperature of the wafer during the processing. The deposition gas reacts at particular temperatures and deposits on the wafer. If the temperature varies greatly across the surface of the wafer, uneven deposition of the reactant gas occurs.

In certain batch processors (i.e., CVD reactors which process more than one wafer at a time) wafers are placed on a relatively large-mass susceptor made of graphite or other heat-absorbing material to help the temperature of the wafers remain uniform. In this context, a "large-mass" susceptor is one which has a large thermal mass relative to the wafer. Mass is equal to the density times volume. The thermal mass is equal to mass times specific heat capacitance.

One example of a large-mass susceptor is shown in U.S. Pat. No. 4,496,609 issued to McNeilly, which discloses a CVD process wherein the wafers are placed directly on a relatively large-mass, slab-like susceptor and maintained in intimate contact to permit a transfer of heat therebetween. The graphite susceptor supposedly acts as a thermal "flywheel" which transfers heat to the wafer to maintain its temperature uniform and relatively constant. The goal is to reduce transient temperature variations around the wafer that would occur without the "flywheel" effect of the susceptor.

In recent years, single-wafer processing of larger diameter wafers has grown for a variety of reasons including its greater precision as opposed to processing batches of wafers at the same time. Although single-wafer processing by itself provides advantages over batch processing, control of process parameters and throughput remains critical. In systems in which the wafer is supported in intimate contact with a large-mass, slab-like susceptor, the necessity of maintaining uniform susceptor temperature during heat-up and cool-down cycles limited the rate at which the temperature could be changed. For example, in order to maintain temperature uniformity across the susceptor, the power input to the edges of the susceptor had to be significantly greater than the power input to the center due to the edge effects.

Another significant problem faced when attempting to obtain high-quality CVD films is particulate contamination. One troublesome source of particulates in the CVD of metals and other conductors is the film that forms on the back side of the wafer under certain conditions. For example, if the wafer back side is unprotected or inadequately protected during deposition, a partial coating of the CVD material forms thereon. This partial coating tends to peel and flake easily for some types of materials, introducing particulates into the chamber during deposition and subsequent handling steps. One example of protecting the back side of a wafer during processing is given in U.S. Pat. No. 5,238,499 to van de Ven, et al. In this patent an inert gas is introduced through a circular groove in the peripheral region of a support platen. In U.S. Pat. No. 5,356,476 to Foster, et al., a semiconductor wafer processing apparatus is shown, including a plurality of ducts for introducing helium or hydrogen around the perimeter of a wafer to prevent flow of reactant gases downwardly into a gap between the perimeter of the wafer and a wafer support lip. The aforementioned devices, however, share the feature of rather large wafer support platens, characterized by the aforementioned detrimental high thermal mass.

Presently, there is a need for an improved wafer support system while ensuring temperature uniformity across the wafer surface.

SUMMARY OF THE INVENTION

The present invention embodies a susceptor which supports a wafer spaced therefrom and effectively decouples conductive heat transfer between the two elements. The wafer is supported on one or more spacers in a recess preferably in an upper surface of the susceptor, the top plane of the wafers preferably being approximately level with an outer ledge of the susceptor. In one arrangement, spacer pins are utilized, and in another a single spacer ring is used. The susceptor preferably includes a plurality of interior passages opening into the recess at a plurality of small sweep gas holes. A sweep gas flows through the susceptor and out the holes and protects the back side of the wafer from deposition gas and particulate contamination. The sweep gas is heated as it flows through the susceptor so as not to cause localized cooling of the wafer and possible areas of slip.

In one embodiment, the susceptor is formed by top and bottom mating sections and the internal passages are formed by grooves in one of the juxtaposed surfaces of the two sections. Desirably, a multi-armed member supports and rotates the susceptor, the member preferably being substantially transparent to radiant energy. The arms of the support member are preferably hollow and deliver sweep gas to the lower surface of the susceptor at apertures in communication with the internal passages. Some of the sweep gas may be diverted to exit the susceptor proximate the spacer pins to provide sweep gas protection therearound at all times.

In another aspect of the invention the spacer ring mentioned is located to be positioned beneath the periphery of the wafer and serves to reduce the size of the sweep gas outlet from beneath the wafer and to block deposition gas from flowing to the wafer backside. The ring is configured to support the wafer in one arrangement. Preferably, the ring and the susceptor are configured to form sweep gas outlet passages. As another embodiment, the ring is spaced slightly from the wafer to provide a thin annular outlet for the sweep gas, and the wafer is supported by pins.

In one aspect, the invention provides a susceptor to be positioned in a high temperature processing chamber for supporting a wafer to be processed. The susceptor includes a thin, substantially disc shaped lower section and a thin, substantially disc shaped upper section having a lower surface in engagement with an upper surface of said lower section. One of the sections has an outer diameter larger than that of the other section, the larger section having a recess in which the other section is positioned. One or more gas channels are defined by the engaging surfaces of the sections. The susceptor includes one or more gas inlets in the lower section opening to its lower surface and the channels. One or more gas outlets in the upper section open to the upper surface of the upper section in an area beneath that in which a wafer to be processed is to be positioned. The mating recess is preferably formed in a lower surface of the upper section. In one form, the channels are formed by grooves in the upper surface of the lower section with the grooves being closed by the lower surface of the upper section. There are preferably three of the inlets each opening to the channels, the channels being interconnected to allow gas flow throughout.

In accordance with another aspect, the invention provides an apparatus for chemical vapor deposition on a semiconductor wafer comprising a deposition chamber having a process gas inlet for injecting process gases into the chamber. A single susceptor is provided in the chamber. A support for the susceptor includes a central shaft positioned below the susceptor axis and a plurality of support arms extending radially and upwardly from the shaft with the arms having upper ends adapted to engage the lower surface and support the susceptor. One or more of the arms are tubular and in registry with inlets in the susceptor so that gas may be conducted through the tubular arms into the inlets.

The present invention also provides a method of supporting a semiconductor wafer in a processing chamber and conducting gas flow beneath the wafer. The method comprises the steps of positioning the wafer on a plurality of spacers protruding upwardly from an upper surface of the susceptor to support the wafer and form a gap between the wafer and the upper surface of the susceptor. The susceptor is supported on a plurality of arms having upper ends engaging a lower surface of the susceptor. Gas flows through one or more of the arms into passages in the susceptor which open to the gap. The gas is allowed to flow outwardly beyond the periphery of the wafer. Desirably, the spacers are positioned in apertures in the susceptor, and some of the gas flows from the arms through the susceptor passages and into the gap via the apertures surrounding the spacers.

In another aspect of the invention, an apparatus for supporting wafers in a semiconductor processing environment includes a lower section and a plurality of disk-shaped upper sections each adapted to register concentrically with the lower section. The upper sections each have a shallow wafer recess sized differently than the other upper sections to enable selection of the upper section depending on the size of wafer to be processed. The apparatus preferably includes at least two upper sections for processing wafers having diameters greater than 100 mm.

In a preferred form of the invention, a rotatable susceptor is positioned generally horizontally in a processing chamber and one or more spacers extend above the susceptors to support a single wafer spaced from the susceptor. A temperature compensation ring surrounds but is slightly spaced from the susceptor and has a generally rectangular exterior shape. The chamber has at least one process gas inlet and at least one gas outlet for flowing deposition and carrier gas across the upper surface of the wafer, and the chamber has a generally rectangular cross-section generally perpendicular to the gas flow across the wafer and the rectangular ring. An inlet section of the chamber is vertically short and the susceptor and the ring are positioned adjacent the inlet section with the upper surface of the ring and the susceptor being generally in the plane of the lower wall of the inlet section. The ring and the susceptor, together with a wafer mounted on the spacers are heated very uniformly by upper and lower heat sources. With this arrangement, the gas has a generally uniform flow across the width of the chamber since deposition occurs on both the heated ring and the wafer. As a result, carrier gas flow is advantageously reduced from that needed with a circular susceptor and a circular temperature compensation ring wherein it is usually necessary to have increased process gas flow across the center of the wafer and reduced flow across the edges of the wafer in order to obtain uniform deposition on the wafer. The reduced carrier gas flow is particularly desirable because of the reduced cooling effect on the thermally sensitive wafer spaced from the susceptor. It is also desirable that the upper and lower heat sources have a generally rectangular heat pattern that coincides with the shape of the exterior of the rectangular ring so that the heat is principally directed to the area defined by the ring exterior.

In another aspect of the invention the system is provided with the capability to modify the ratio of heat provided by upper and lower heat recesses during the processing of a wafer, so as to promote rapid uniform heating.

With the wafer no longer in contact with the susceptor, the wafer temperature can be maintained uniform even where the susceptor experiences temperature nonuniformities during heat-up and cool-down. In this manner, heat-up and cool-down times can possibly be reduced. Process throughput is thereby increased, as desired. Another aspect of the invention allows for the processing of wafers without the creation of haze or other undesirable effects on the underside of the wafer. This improvement, provided by removing the wafer from contact with the susceptor and bathing its underside with a gas, e.g. hydrogen, is particularly important where doublesided polished wafers are being processed.

BRIEF DESCRIPTION OF THE DRAWINGS

FIG. 2a is a detailed view of one embodiment of a wafer spacer in the form of a pin;

FIG. 2b is a detailed view of an alternative wafer spacer in the form of a sphere;

FIG. 2c is a view of an alternative wafer spacer configuration;

FIG. 6 is a top plan view of a susceptor support for use in the wafer support system of the present invention, taken along line 6—6 of FIG. 3;

FIG. 7 is a cross-sectional view of another wafer support system according to the present invention;

FIG. 15 is a top plan view of a second version of the top section of the segmented susceptor for use in the wafer support system of FIG. 11;

FIG. 16 is a top plan view of a third version of the top section of the segmented susceptor for use in the wafer support system of FIG. 11;

FIG. 17 is a top plan view of a fourth version of the top section of the segmented susceptor for use in the wafer support system of FIG. 11;

FIG. 18 is a cross-sectional view through another variation of a reactor chamber incorporating the wafer support system of the invention;

FIG. 21C is a cross-sectional view of the segments of 21A and B assembled and supporting a wafer.

FIG. 22A illustrates a top-plan view of the lower segment of another segmented susceptor design with a portion of an upper segment superimposed thereon to illustrate the relationship between the two.

FIG. 25 is a view taken on line 25—25 of FIG. 24.

FIG. 25A is a view on line 25A—25A of FIG. 25, with a fragmentary, broken line showing of a susceptor and a wafer.

FIG. 25B is a view on line 25B—25B of FIG. 25.

FIG. 25C is a view on line 25C—25C of FIG. 25.

FIG. 27 is a view on line 27—27 of FIG. 26.

FIG. 27A is a view on line on line 27A—27A of FIG. 27, with a fragmentary, broken line showing of a susceptor and a wafer.

FIG. 27B is a view on line 27B—27B of FIG. 27.

FIG. 27C is a cross-sectional view of a variation of the ring of FIG. 27B.

FIG. 27D is an enlarged view of the area identified by circle 27D shown on FIG. 27B.

DETAILED DESCRIPTION OF THE PREFERRED EMBODIMENTS

Figure 1:
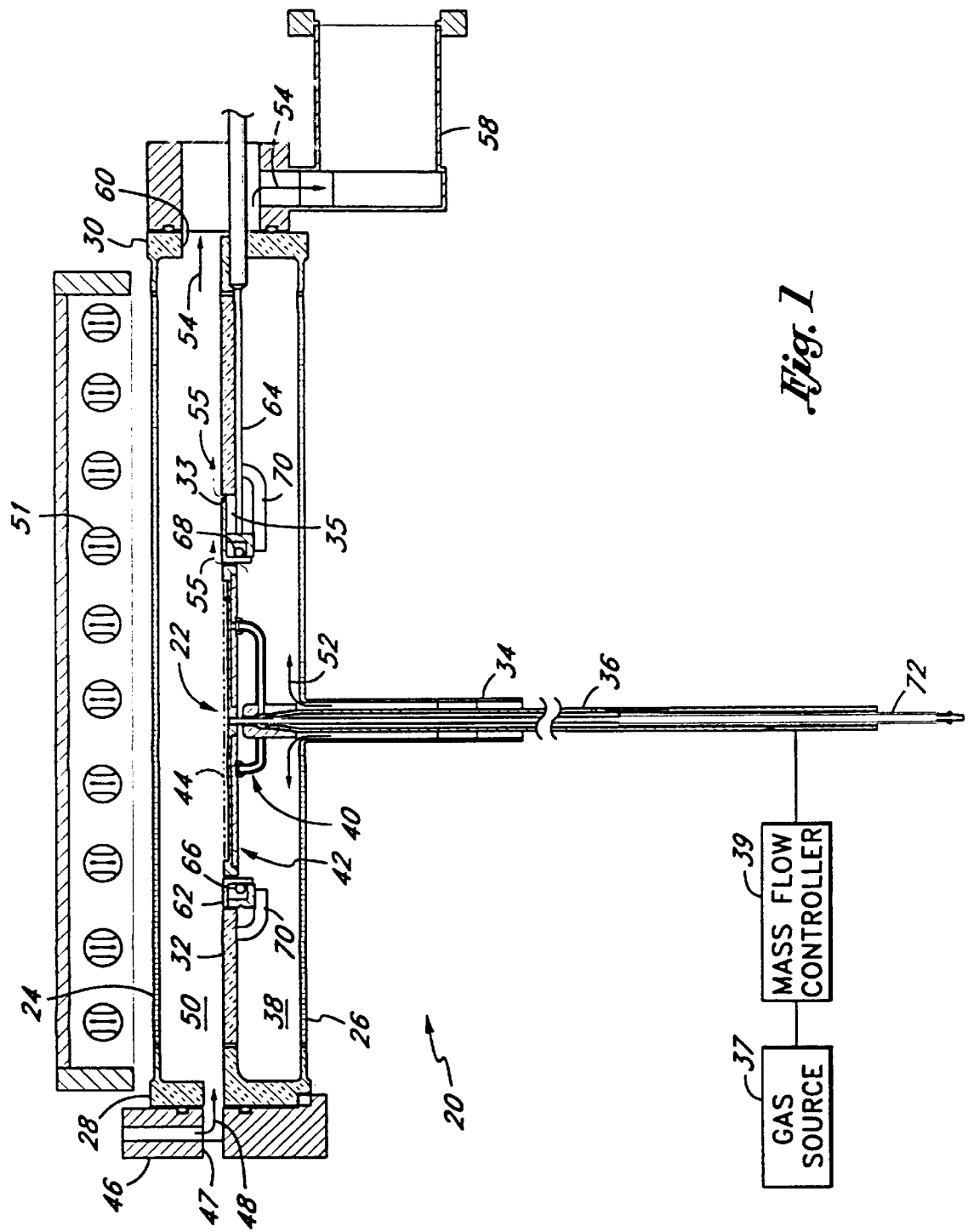
FIG. 1 is a cross-sectional view along the longer of two horizontal axes through a reactor chamber incorporating an improved wafer support system of the present invention.

FIG. 1 illustrates a reactor chamber 20 for processing semiconductor wafers, within which a wafer support system 22 of the present invention is incorporated. Prior to discussing the details of the wafer support system 22, the elements of the reaction chamber 20 will be described. The support system is suitable for many types of wafer processing systems, another one being shown in FIGS. 18 and 19, and the discussion herein should not be limited to one particular type of reaction chamber.

The chamber 20 comprises a quartz tube defined by an upper wall 24, a lower wall 26, an upstream flange 28, and a downstream flange 30. Although not shown in the figure, the walls have a concave inner surface and a convex outer surface which, when viewed from a lateral cross-section, has a lenticular shape; and lateral edges of the reaction chamber 20 include relatively thick side rails between which a chamber support plate 32 is attached. FIG. 1 is a longitudinal cross-section along a central vertical plane of the chamber 20 illustrating the vertical dimension of the lenticular shape; the side rails are thus not seen. Preferably, the chamber 20 is manufactured from quartz. The chamber support plate 32 reinforces the chamber 20 during vacuum processing and extends between the side rails (not shown), preferably along the center line of the chamber 20. The support plate 32 includes an aperture 33 defining a void or opening 35 extending across the lateral dimension of the chamber 20 between the side rails. The aperture 33 divides the support plate 32 into an upstream section extending from the upstream flange 28 to an upstream edge of the aperture, and a downstream section extending from a downstream of the aperture to the downstream flange 30. The upstream section of the support plate 32 is preferably shorter in the longitudinal direction than the downstream section.

An elongated tube 34 depends from a centrally located region of the lower wall 26. A drive shaft 36 extends through the tube 34 and into a lower region 38 of the chamber 20. The lower region 38 is defined between the central chamber support plate 32 and the lower wall 26. The upper end of the drive shaft 36 is tapered to fit within a recess of a multi-armed support or spider assembly 40 for rotating a segmented susceptor 42. The susceptor 42 supports a wafer 44, shown in phantom. A motor (not shown) drives the shaft 36 to, in turn, rotate the wafer support system 22 and wafer 44 thereon within the aperture 33. A gas injector 46 introduces process gas, as indicated by arrow 48, into an upper region 50 of the chamber 20. The upper region 50 is defined between the upper wall 24 and the chamber support plate 32. The process gas passes over the top surface of the wafer 44 to deposit chemicals thereon. The system typically includes a plurality of radiant heat lamps arrayed around the outside of the reaction chamber 20 for heating the wafer 44 and catalyzing the chemical deposition thereon. An upper bank of elongated heat lamps 51 is illustrated outside of the upper wall 24, and typically a lower bank of lamps arranged cross-wise to the upper bank is also utilized. Further, a concentrated array of lamps directed upward from underneath the susceptor 42 is often used.

A source of sweep gas 37 is schematically shown connected through a mass flow controller 39 to the drive shaft 36. Gas flows into the space within the hollow shaft 36 and is eventually directed upward through the susceptor 42, as will be more fully described below. The fluid coupling allowing gas to the interior of the hollow, rotating shaft 36 is not shown, but may accomplished by a number of means, one of which is shown and described in U.S. Pat. No. 4,821,674, issued Apr. 18, 1989, hereby expressly incorporated by reference.

A wafer is introduced to the reaction chamber 20 through a wafer entry port 47. The wafer is typically transported by a robot pick-up arm (not shown) which enters through the port 47 and extends over the wafer support system 22 to deposit the wafer thereon. The CVD system then seals the reaction chamber 20 and introduces deposition gas with a carrier gas such as hydrogen for depositing a layer of silicon or other material on the wafer. After processing, a gate valve opens and the robot pick-up arm enters through the port 47 and retracts the wafer from the susceptor 42. Periodically, the reaction chamber 20 must be conditioned for subsequent processing. A typical sequence is the introduction of an etch gas into the reaction chamber with the gate valve closed to clean any particular deposition from the interior walls. After the etching, a silicon precursor is sometimes introduced into the chamber to provide a thin coat of silicon on the susceptor 42. Such a coating step is sometimes termed capping. After the etching and capping steps, the chamber is purged with hydrogen and heated for introduction of the next wafer.

The tube 34 is sized slightly larger than the drive shaft 36 to provide space therebetween through which purge gas 52 flows. The purge gas enters the lower region 38 of the reaction chamber 20 to help prevent reactant gas from depositing in the lower region. In this respect, the purge gas 52 creates a positive pressure below the wafer support system 22, which helps prevent reactant gas from traveling around the sides of the segment susceptor 42 in the lower region 38. The purge gas is then exhausted, as indicated with arrows 55, between the susceptor 42 and aperture 33 into the upper region 50 and then through an elongated slot 60 in the downstream flange 30. This ensures that reactant gases do not migrate into the lower region 38. The purge gas continues through an exhaust system 58. The reactant gas likewise passes through the elongated slot 60 in the downstream flange 30 to be vented through the exhaust system 58.

Preferably, a temperature compensation ring 62 surrounds the wafer support system 22. The ring 62 fits in the opening 35 created by the aperture 33 in the support plate 32, and the wafer support system 22 and ring substantially fill the opening and provide structure between the lower and upper chamber regions 38, 50. The susceptor 42 rotates within the ring 62 and is preferably spaced therefrom across a small annular gap of between 0.5 and 1.5 millimeters. The shape of the aperture 33 in the support plate 32 surrounding the ring 62 can be made circular so that the edges of the opening 35 are in close proximity to the ring. However, it has been found that a generally rectangular aperture 33 is preferred. In this respect, the ring 62 may have a generally rectangular outer periphery, or a second structure may be utilized to fill the gap between the circular ring and the aperture 33. As will be described in greater detail below, the susceptor 42 is preferably manufactured to have a constant outer diameter to fit within the ring 62, and surrounding aperture 33. Although the susceptor 42 has a constant outer diameter, it will be seen that various configurations are provided for processing a number of different size wafers.

In a particularly advantageous embodiment, the temperature compensation ring 62 comprises a two-part structure circular ring having a cavity therein for receiving thermocouples 64. In the embodiment shown, the thermocouples 64 enter the chamber 20 through apertures formed in the downstream flange 30 and extend underneath the support plate 32 into the temperature compensation ring 62. The apertures in the quartz flange 30 substantially prevent gas leakage around the thermocouples 64, although typically no additional seal is used. There are preferably three such thermocouples, one terminating at a leading edge 66, one terminating at a trailing edge 68, and one terminating at either of the lateral sides of the ring 62. The thermocouples within the ring 62 surrounding the segmented susceptor 42 provide good temperature information feedback for accurate control of the radiant heating lamps. A plurality of bent fingers 70 attached to the support plate 32 support the ring 62 around the periphery of the susceptor 42. In addition to the ring 62 and thermocouples therein, a central thermocouple 72 extends upward through the drive shaft 36, which is hollow, and through the spider assembly 40 to terminate underneath the center of the susceptor 42. The central thermocouple 72 thus provides an accurate gauge of the temperature near the center of the wafer 44. Because the temperature of a wafer changes quickly in the present system, it is desirable that the mass of the thermocouples be minimized to speed response time.

Figure 2:
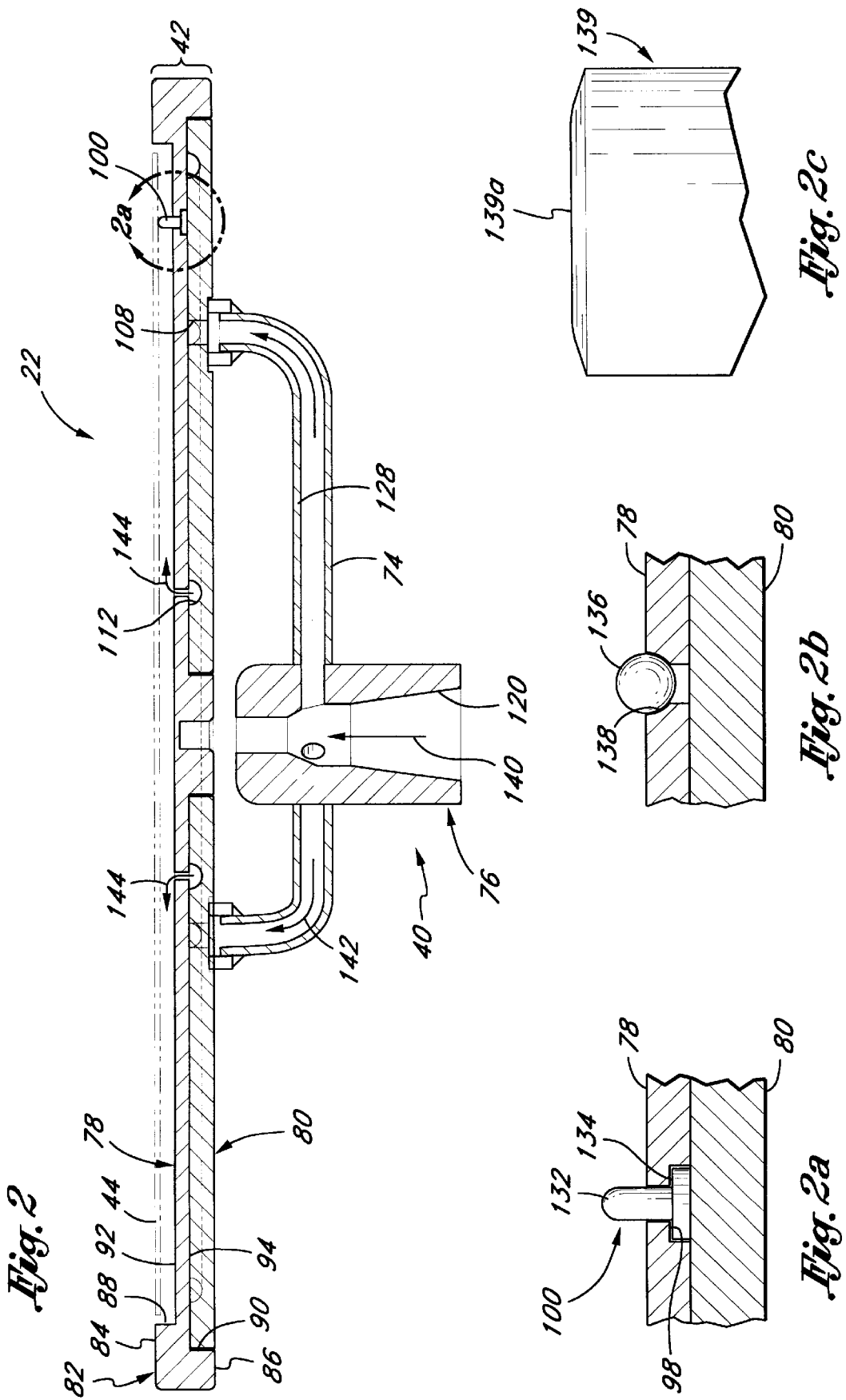
FIG. 2 is a cross-sectional view through one embodiment of a wafer support system of the present invention.

Referring to FIG. 2, a first embodiment of a wafer support system 22 is shown. Again, the system 22 generally comprises the segmented susceptor 42 supported by arms 74 of the spider assembly 40. The arms 74 extend radially outward from a hub 76 and bend vertically upward at predetermined radial distances to contact the underside of the susceptor 42. The segmented susceptor 42 comprises an upper section 78 and a lower section 80, both sections being generally planar disk-shaped elements. Both sections 78, 80 of the susceptor 42 are preferably machined out of graphite and fit closely together without additional fastening means to ensure minimal gas leakage therebetween. A gap of less than 0.001 inch between the adjacent circular surfaces of the upper and lower sections 78, 80 is acceptable for this purpose. A thin coating of silicon carbide may be formed on one or both sections 78, 80. The thickness of the susceptor 42 is preferably about 0.30 inches.

Figure 3:
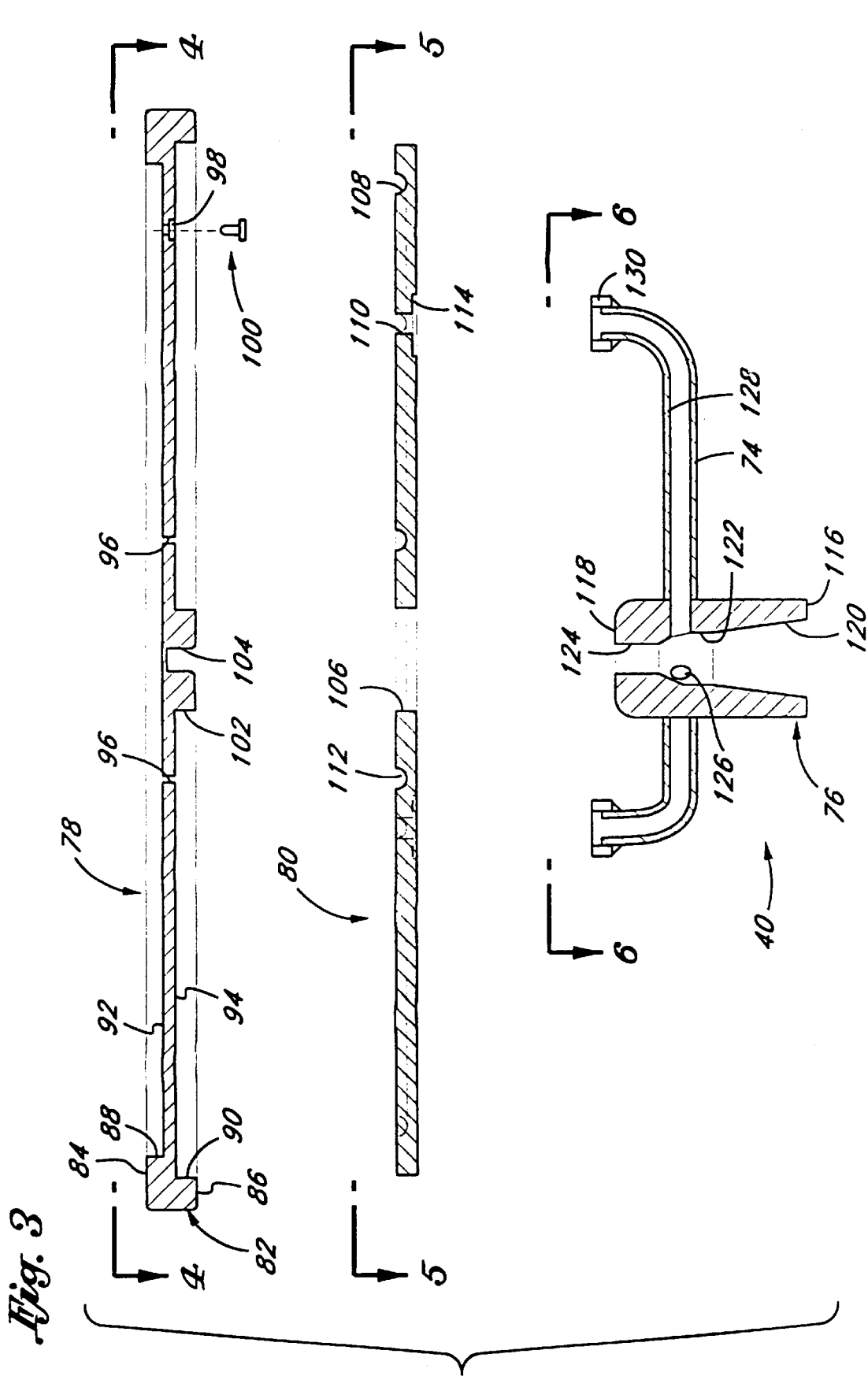
FIG. 3 is an exploded view of the wafer support system illustrated in FIG. 2.

With reference to the exploded view of FIG. 3, the upper section 78 generally comprises an outer ring 82 surrounding a thinner circular middle portion. The outer ring 82 comprises an upper rim or ledge 84 and a lower rim or skirt 86 which terminate at upper and lower shoulders or steps 88, 90, respectively. The upper step 88 forms a transition between the ledge 84 and a circular wafer-receiving recess 92. The lower step 90 forms a transition between the skirt 86 and an annular recess 94 in the underside of the upper section 78. The upper section 78 further includes a circular pattern of sweep gas outlets 96 symmetrically disposed about the central axis of the upper section, and in the recess 92.

At spaced locations distributed around a circle concentric about the axis of the susceptor 42, a plurality of counter-bored holes 98 are formed proximate the upper step 88. The counter-bored holes 98 include a smaller through hole opening to the circular recess 42 and a larger counterbore concentric with the smaller through hole and opening downwardly to the annular recess 94. Each counter-bored hole 98 is sized to receive a wafer support or spacer 100 which projects into the circular recess 92. The wafer 44 rests on the spacers 100 above the floor of the recess 92. In this respect, the recess 92 is sized to receive a wafer therein so that the edge of the wafer is very close to the step 88. The upper section 78 further includes a downwardly depending central spindle 102 defining a radially inner border of the annular recess 94. A central thermocouple cavity 104 is defined in the spindle 102 for receiving a sensing end of the central thermocouple 72 previously described.

Figure 5:
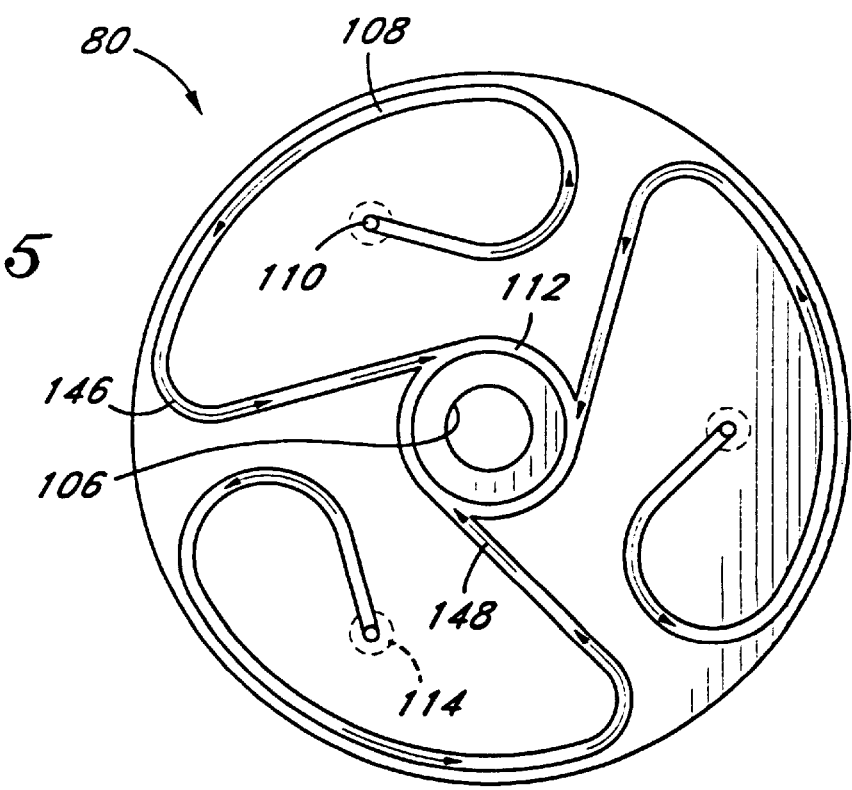
FIG. 5 is a top plan view of a lower section of the segmented susceptor taken along line 5—5 of FIG. 3.

With reference to FIGS. 3 and 5, the annular lower section 80 comprises a central through bore 106 sized to fit around the downwardly depending spindle 102 of the upper section 78. The upper surface of the lower section 80 includes a plurality of gas passage grooves. More specifically, a pattern of curvilinear distribution grooves 108 extend between a plurality of gas flow passages 110 and a central circular delivery groove 112. Each of the grooves 108 and 112 is generally semicircular in cross section and has a depth approximately equal to half the thickness of the lower section 80. Each of the gas flow passages 110 opens downwardly into shallow spider arm cavities 114.

With reference to FIGS. 3 and 6, the spider assembly 40 is described in more detail. The central hub 76 comprises a generally hollow cylindrical member having a vertical through bore extending from a lower surface 116 to an upper surface 118. The through bore comprises a lower shaft-receiving tapered portion 120, a central gas plenum 122, and an upper thermocouple channel 124. The lower tapered portion 120 receives the tapered upper end of the hollow drive shaft 36, the two elements having identical taper angles to fit snugly together. The thermocouple channel 124 receives the central thermocouple 72 which extends upward into the thermocouple cavity 104 in the upper section 78 of the segmented susceptor 42. The gas plenum 122 includes a plurality of apertures 126 aligned with each of the support arms 74. In this respect, the support arms are hollow, with an interior defining sweep gas passages 128. The upwardly directed terminal ends of the arms 74 are reinforced by annular lips 130. The lips 130 are sized to fit closely within the shallow arm-receiving cavities 114 in the underside of the lower section 80. The shaft 36 rotatably drives the spider assembly 40 which, in turn, drives the susceptor 42 by the registration between the lips 130 and the shallow cavities 114 in the underside of the lower section 80.

In an alternative embodiment, the curved arms of the spider assembly 40 may be replaced by a pair of perpendicularly disposed tubes. That is, for each of the three arms, a first tube may extend radially outward from the central hub 76 and couple with a second larger tube perpendicular thereto and extending upward to fit closely within the arm receiving cavities 114. This arrangement can be visualized somewhat like a corncob pipe. The first tubes of each arm may radiate horizontally from the hub 76 or may be slightly upwardly angled. Utilizing straight cylindrical sections, rather than a curved quartz tube, is less expensive to manufacture.

Referring back to FIG. 2, the spacers 100 may take several shapes. In one preferred embodiment, seen in detail in FIG. 2a, the spacer 100 is in the form of a pin comprising an elongated upper portion 132 having a small rounded head. A base 134 sized larger than the elongated portion 132 fits within the counter-bored hole 98. The base 134 rests on the upper surface of the lower section 80. The heads of the elongated portions 132 of the multiple spacers 100 terminate at the same height to provide a planar support surface for the wafer 44. The upper portion of the counterbored holes 98 is approximately 0.062 inches in diameter and the spacers 100 fit therein. The spacers 100 should preferably space a wafer above the recess in a range of about 0.010 to about 0.200 inches; or more preferably in a range of about 0.060 to about 0.090 inches; and most preferably the spacers 100 support the wafer 44 over the floor of the recess, a height of about 0.075 inches. This is about three times the thickness of a typical wafer. This spacing is significantly greater than the deviation from flatness of the susceptor or wafer which is in the order of 0.005–0.010 inches. Also the spacing is much greater than the depth of a grid on the upper surface of a prior art susceptor which had been designed to optimize thermal contact between the susceptor and wafer while also facilitating wafer pickup. In a preferred embodiment, the depth of the recess 92 and spacer 100 height is such that the top surface of the wafer 44 is in the plane of the outer ledge 84 to minimize any irregularity or transition and smooth gas flow thereover. Alternatively, the ledge 84 might be formed above or below the top of the wafer 44 as desired.

In an alternative embodiment, seen in FIG. 2b, the spacer 100 takes the form of a sphere 136 which fits within a cradle 138 formed in the upper surface of the upper section 78. The spacer 100 may even be formed integrally in the upper section 78. Desirably, the upper wafer contacting portion of the spacer 100 is rounded or terminates in a point to minimize contact area with the wafer.

FIG. 2c, however, illustrates an alternative pin head configuration that is useful with systems in which the wafer is dropped a short distance when being placed on the pins. That is, in one wafer transport system, the wafer is held by use of a so-called Bernoulli wand wherein a wafer is held from above by radially outward gas flow, without the wafer upper surface being touched by the wand. After a wafer is moved into position slightly above a susceptor, the gas flow is interrupted and the wafer falls onto the spacers. While the fall distance is very slight, there is some possibility of a spacer pin with point contact chipping or marring the surface of the wafer contacting the spacer. To minimize that possibility, the pin head of FIG. 2c has a flat upper surface 139 with rounded shoulders 139a. Preferably, the diameter of the flat area is in the range of about 0.025" to 0.045", or the entire upper surface of about 0.055" could be flat. It is also desirable that the flat surface 139 be polished to remove roughness on the surface that could possibly damage the wafer.

The fixed spacers 100 define a planar support platform or stand for the wafer 44 to space the wafer above the segmented susceptor 42, and in this respect at least three spacers are required, although more than three may be provided. Preferably, the spacers 100 are manufactured of a ceramic or naturally occurring or synthetically fabricated sapphire, sapphire being a single crystal structure derived from aluminum oxide. In an alternative configuration, the spacers 100 may be formed of amorphous quartz, although this material may eventually devitrify from the repeated thermal cycling within the reaction chamber 20. Further materials which may be used for the spacers include monocrystalline or single crystal quartz, silicon carbide, silicon nitride, boron carbide, boron nitride, aluminum nitride, and zirconium carbide, or other hightemperature resistant material capable of withstanding the extreme temperatures and the chemical environment in the wafer processing chamber. Any of these materials may additionally be coated with Si, $Si_3N_4$, $SiO_2$ or SiC to protect the spacers from deterioration from exposure to process gases.

To prevent back-side contamination of the wafer 44 from reactant gases entering between the wafer and the susceptor 42, a novel sweep gas system is provided. The system also preheats the gas which contacts the wafer and which if not heated would cause localized cooling and possible areas of slip on the wafer. More particularly and with reference to FIG. 2, the sweep gas enters the wafer support system through the hollow drive shaft 36 and into the plenum 122, as indicated with arrow 140. The gas is then distributed through the apertures 126 and into the sweep gas passages 128 within the arms 74. The gas continues in an inlet flow 142 into the gas flow passage 110 through the lower section 80. The distribution grooves 108 along with the lower surface of the upper section define gas channels between the upper and lower sections 78, 80. Referring to FIG. 5, the gas flows along the channels following the various distribution grooves 108 to finally reach the circular delivery groove 112, thereafter exiting through the sweep gas outlets 96, as indicated by arrow 144. The gas flow through the distribution grooves is shown by arrows 146. The gas flow into the delivery groove 112 is shown by arrows 148. The specific arrangement of the distribution grooves 108 may be different than that shown in FIG. 5. The arrangement shown helps reduce temperature nonuniformities through the lower section 80 and through the segmented susceptor 42 as a whole by channeling the sweep gas in a circuitous and symmetric path through the lower section. Desirably, the grooves 108 traverse a nonlinear path from the gas flow passages 110 to the central circular delivery groove 112 and sweep gas outlets 96.

Figure 4:
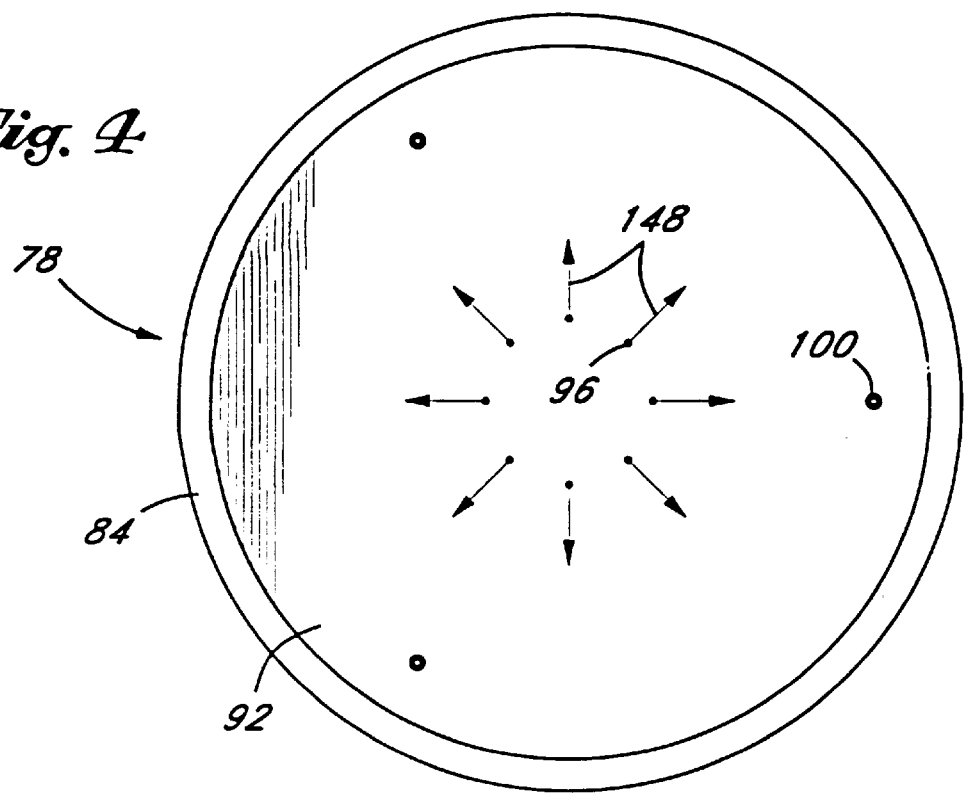
FIG. 4 is a top plan view of an upper section of a segmented susceptor of the wafer support system taken along line 4—4 of FIG. 3.

The circular delivery groove 112 is formed directly underneath the circular pattern of sweep gas outlets 96. As seen in FIG. 4, the even distribution of gas through the groove 112 ensures that the sweep gas flow 148 leaving the outlets 96 is axisymmetric about the center of the susceptor 42 in a radially outward direction. In this manner, any reactant gas which might enter between the wafer and the susceptor is swept radially outward from underneath the wafer. Desirably, a flow rate of less than 5 standard liters/minute of sweep gas through the hollow shaft 36 and segmented susceptor is utilized, and a flow rate of less than 3 standard liters/minute is preferred.

Although other gases may be substituted, hydrogen is preferred as it is compatible with many CVD processing regimes. As a result of the excellent control over the backside of the wafer through the use of the purge gas, wafers with double-sided polishing can be processed successfully, unlike a system with the wafer in contact with the susceptor.

The present invention includes the mass flow controller 39 to regulate the flow of sweep gas through the hollow shaft 36 and segmented susceptor for different processing pressures. That is, some processes are at atmospheric pressure, and some are at reduced pressure. In the case of a fixed restriction to control flow, a reduced pressure process will tend to increase the flow of gas through the sweep gas outlets 96 as compared to an atmospheric process, all other variables remaining the same. Thus, the mass flow controller 39 operates independently from the process pressure to ensure a constant flow of less than 5 standard liters/minute.

Figure 8:
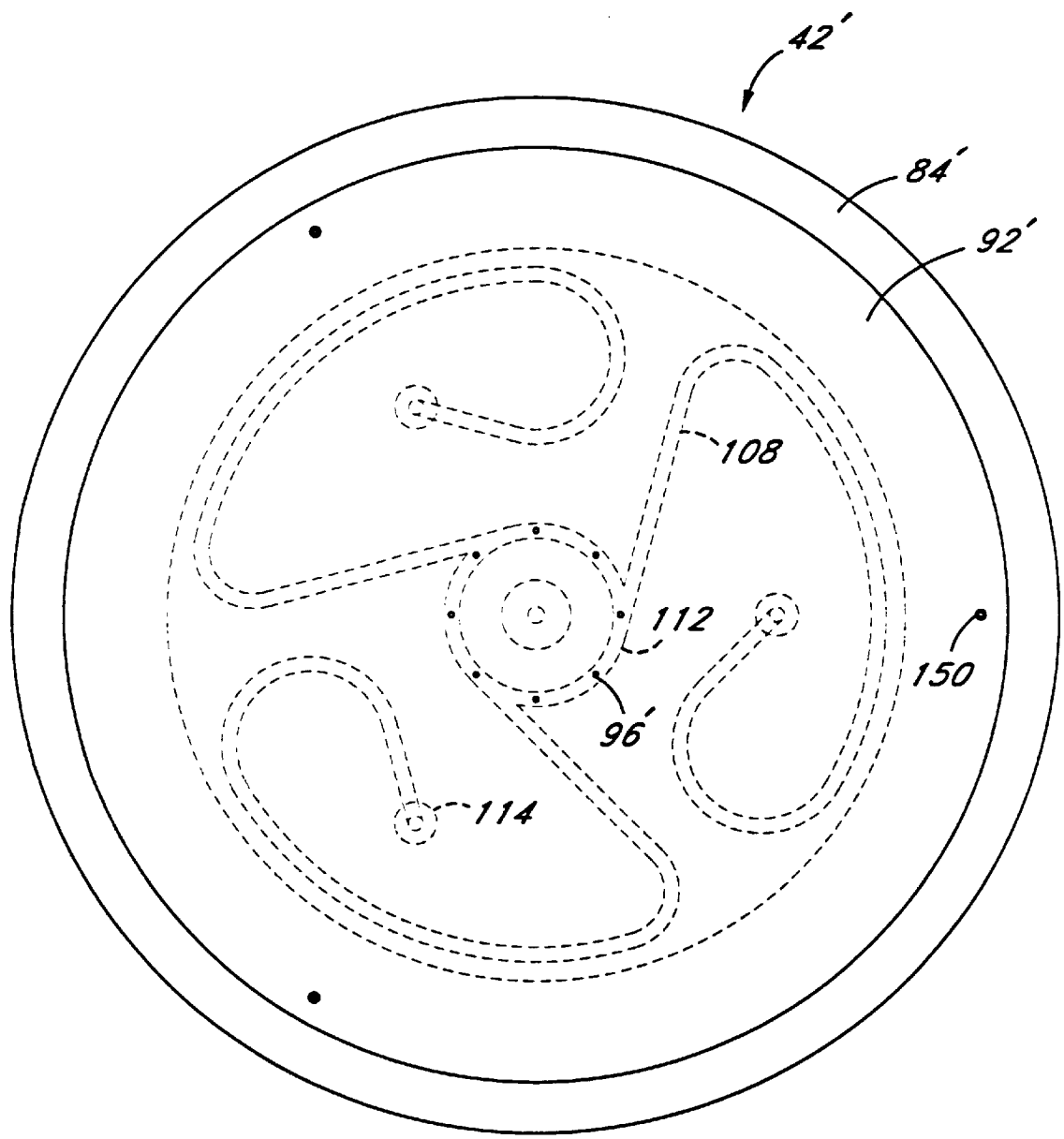
FIG. 8 is a top plan view of a segmented susceptor for use in the wafer support system of FIG. 7, taken along line 8—8.

FIGS. 7 and 8 illustrate another wafer support system 22' which utilizes some of the same elements as the wafer support system 22 shown in FIG. 2. More particularly, the spider assembly 40 and lower section 80 of the segmented susceptor 42' are identical to those shown and described with reference to the first embodiment. The segmented susceptor 42', however, includes a modified upper section 78', with an outer ring 82' comprising an upper ledge 84' and a lower skirt 86'. The upper ledge 84' is sized similar to the ledge 84 described with respect to the first embodiment and terminates in a circular step 88' leading to a circular recess 92'. The circular recess 92' extends radially outwardly past the lower section 80. In relative terms, the lower skirt 86' is substantially greater in the radial dimension in comparison to the skirt 86 described for the first embodiment, yet the step 90' is sized the same as the step 90 in the first embodiment. This allows the upper section 78 to receive the annular lower section 80 therein, just as in the first embodiment.

In a departure from the first embodiment, as seen in FIG. 7, the susceptor 42' includes a plurality of spacers in the form of support pins 150 circumferentially distributed about a circle around the central axis of the susceptor 42' in the region between the upper step 88' and the lower step 90'. More particularly, the pins 150 extend within stepped cavities 152, extending through the upper section 78' from the recess 92' to the extended skirt 86'. The pins 150 shown are somewhat different than the first two embodiments described with respect to FIGS. 2a and 2b, and comprise simple cylindrical elements having rounded heads in contact with the wafer 44'.

Figure 9:
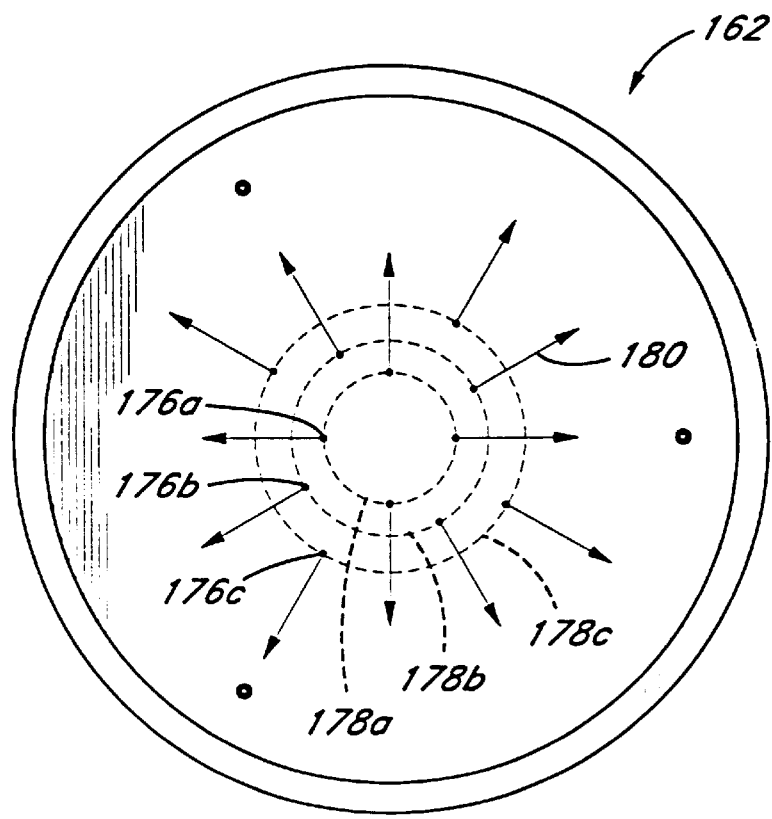
FIG. 9 is a top plan view of an alternative upper section of a segmented susceptor having gas outlets distributed around concentric circles.
Figure 10:
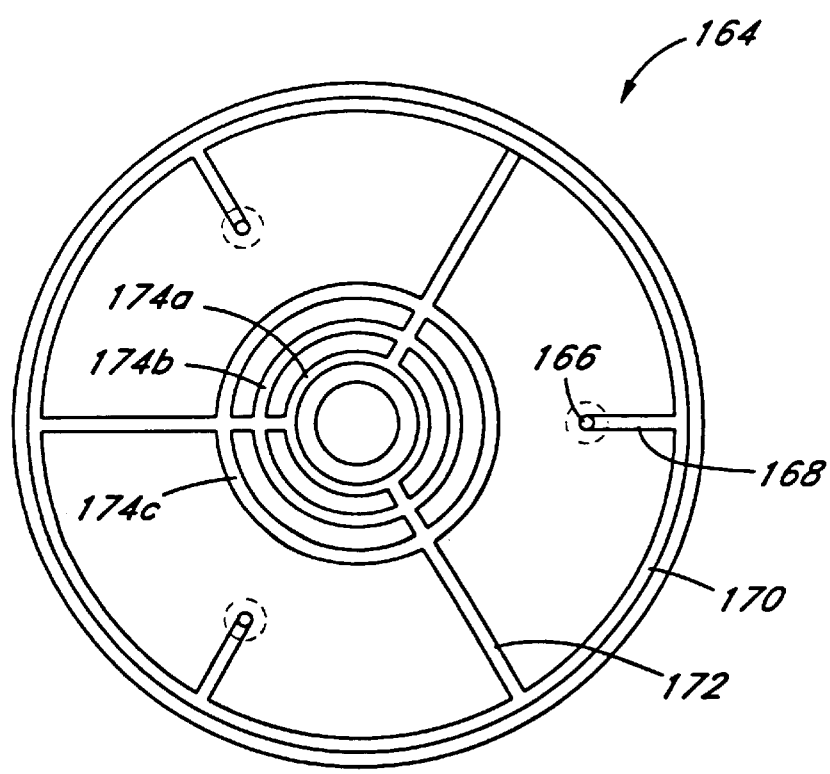
FIG. 10 is a top plan view of an alternative lower section of a segmented susceptor having multiple gas delivery grooves arranged in concentric circles.

An alternative embodiment of gas passage grooves through the susceptor is shown in FIGS. 9 and 10. As before, the spider assembly 40 supports a modified susceptor having an upper section 162 and a lower section 164. The lower section 164 includes three gas passages 166 opening downwardly to receive the upper ends of the spider assembly arms 74. In this respect, the locations of the sweep gas inputs are in the same location as with the first two susceptor embodiments 42 and 42'. From there, however, distribution grooves 168 in the upper surface of the lower section 164 extend radially outward to an outer circular groove 170. Secondary grooves 172 channel the sweep gas radially inward to intersect a series of concentric circular delivery grooves 174a, 174b and 174c located at spaced radii. Each secondary groove 172 preferably lies along a line which bisects the included angle defined between each pair of distribution grooves 168.

Looking at FIGS. 9 and 10, the upper section 162 includes a plurality of gas outlets arranged in a series of concentric circles corresponding to the circular delivery grooves 174a, 174b and 174c. More particularly, a first group of outlets 176a lie along an inner circle 178a at the same radius of the smallest delivery groove 174a.

Likewise, two more groups of outlets 176b and 176c are arranged about outer concentric circles 178b and 178c, respectively, which correspond to the outer delivery grooves 174*b* and 174*c*.

Four outlets 176 are shown distributed evenly about each of the circles 178*a,b,c*, but more or less may be provided. Furthermore, the circumferential orientation of the outlets 176 may be staggered between the circles 178 as shown. With four outlets 176 per circle 178, each pattern of outlets is rotated 30° with respect to one of the other patterns. Alternatively, for example, eight outlets 176 per circle 178 evenly distributed and staggered would mean that each pattern of outlets is rotated 15° with respect to one of the other patterns. The staggering between patterns creates a more effective gas sweep under the wafer, as shown by arrows 180, than if the outlets 176 were aligned.

In another variation, the upper section 162 may be used with the lower section 80 described above with respect to FIGS. 3 and 5 as long as the inner circle 178*a* of outlets 176*a* aligns with the circular delivery groove 112. In that case, the outer circles 178*b,c* of outlets 176*b,c* would not be used. Additionally, the lower section 164 may be used with either of the above described upper sections 78, 78' as long as the inner delivery groove 174*a* aligns with the circular pattern of outlets 96, 96'. In that case, the outer delivery grooves 174*b,c* would not be used. Of course, other variations are contemplated.

The separation between the wafer 44 and the segmented susceptor 42, as well as the minimal direct support provided by the three spacers 100, effectively decouples the wafer and susceptor from heat conduction therebetween. The wafer 44 temperature is thus influenced primarily from radiant heat flux provided by the lamps surrounding the chamber.

The spider assembly 40 is preferably constructed of quartz to provide a transparent support to the underside of the susceptor 42 to minimize the obstruction of radiant heat emitted from the lower heat lamps. Although quartz is preferred, other materials having a relatively high coefficient of radiant heat transmission may be utilized. To construct the spider assembly 40, the hub 76 is first machined into the proper shape. The tubular arms 74 are bent from straight portions and attached to the hub 76 by welding, for example. Heat treating and fire polishing reduce internal stresses in the quartz.

Figure 11:
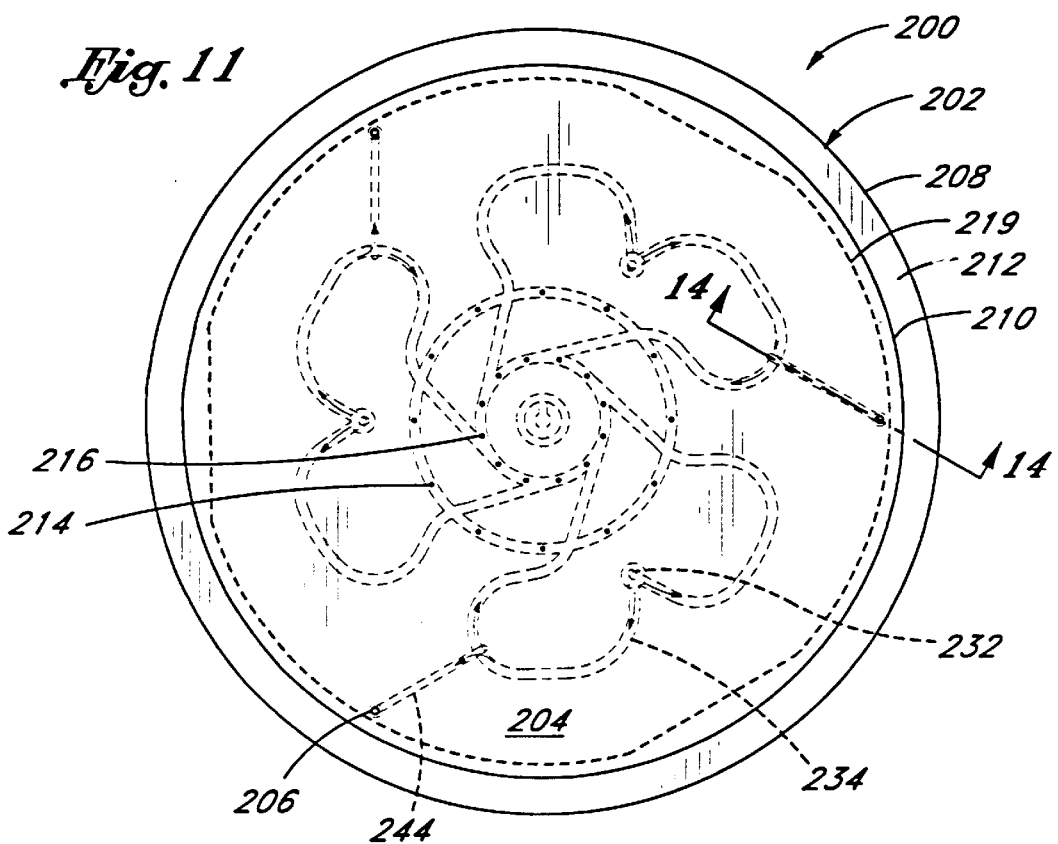
FIG. 11 is a top plan view of a preferred wafer support system of the present invention.

FIG. 11 illustrates a top plan view of another wafer support system 200 of the present invention again comprising a segmented susceptor 202 having a concentric recess 204 in a top surface, and a plurality of wafer support spacers 206 positioned within the recess.

Figure 12:
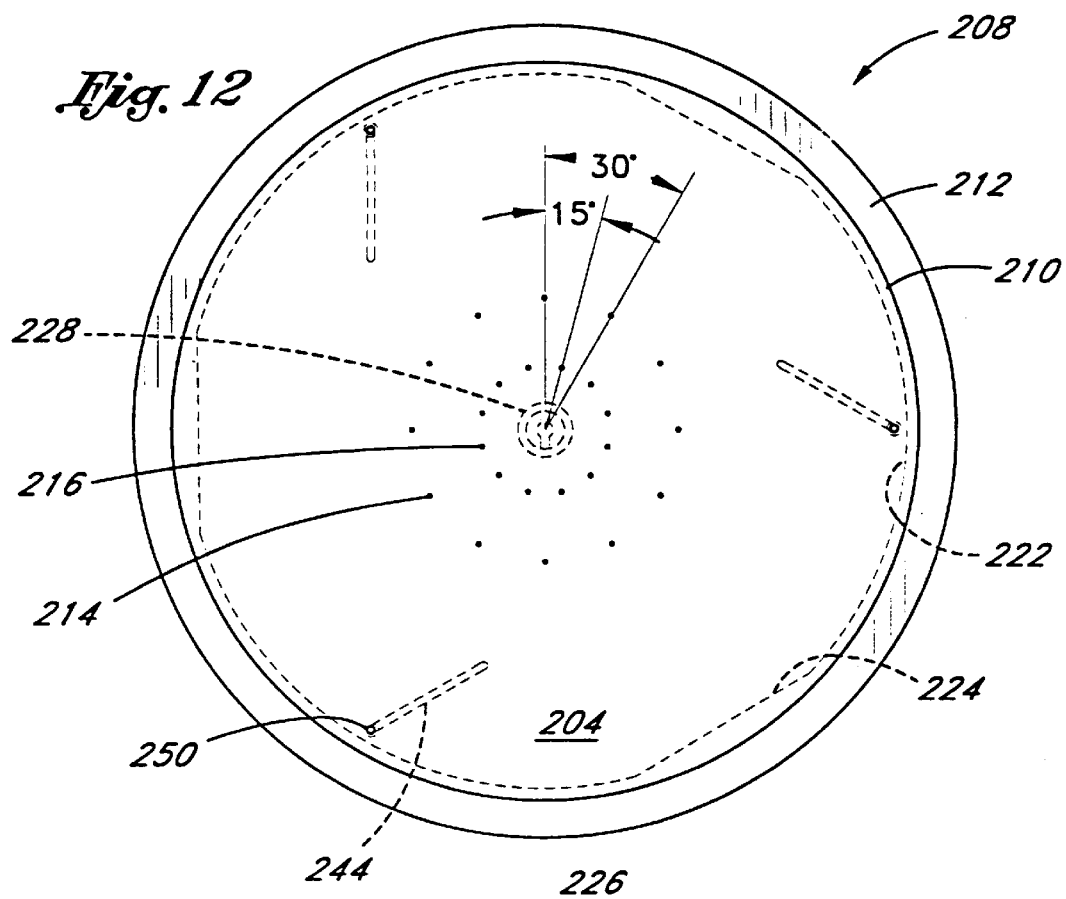
FIG. 12 is a top plan view of a first version of a top section of a segmented susceptor for use in the wafer support system of FIG. 11.

With reference FIG. 12 which illustrates a top section 208 of the segmented susceptor 202, the shallow recess 204 is defined around its outer perimeter by a circular step 210 leading to a ledge 212 which forms the uppermost surface of the susceptor. The construction is, in many respects, similar to the susceptors previously described.

In a departure from the previously described susceptors, the segmented susceptor 208 includes two concentric circles of sweep gas outlets. An outer circle of twelve sweep gas outlets 214 surrounds an inner circle of twelve sweep gas outlets 216. It can be readily seen from FIG. 12 that the outer sweep gas outlets are distributed about the center of the segmented susceptor 208 at intervals of 30°, or at 1:00, 2:00, etc. The inner circle of sweep gas outlets 216, on the other hand, are offset 15° rotationally with respect to the outer circle, and thus occupy rotational positions at 12:30, 1:30, etc., intermediate the outer circle of outlets. This increased number of sweep gas outlets and staggered relationship of the concentric circles increases the uniformity of sweep gas underneath the wafer and improves performance therefor; as was previously described with respect to FIG. 9.

Figure 14:
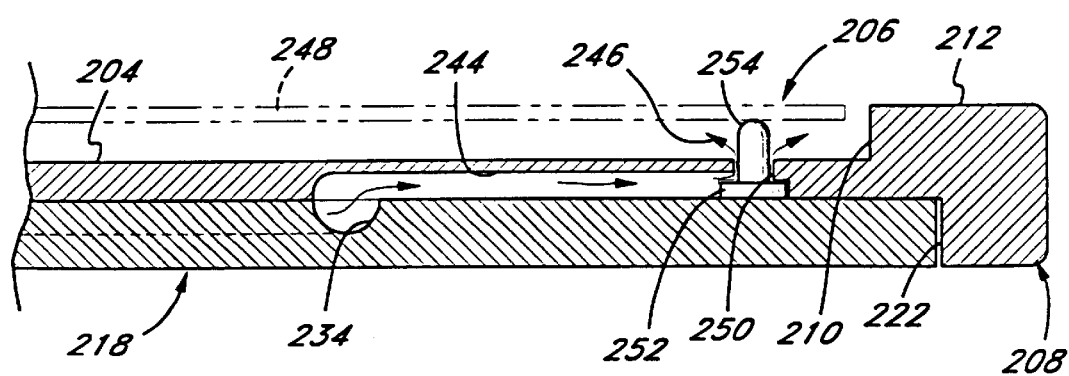
FIG. 14 is a cross-sectional view of a captured wafer spacer and purge channel within the segmented susceptor, taken along line 14—14 of FIG. 11.
Figure 13:
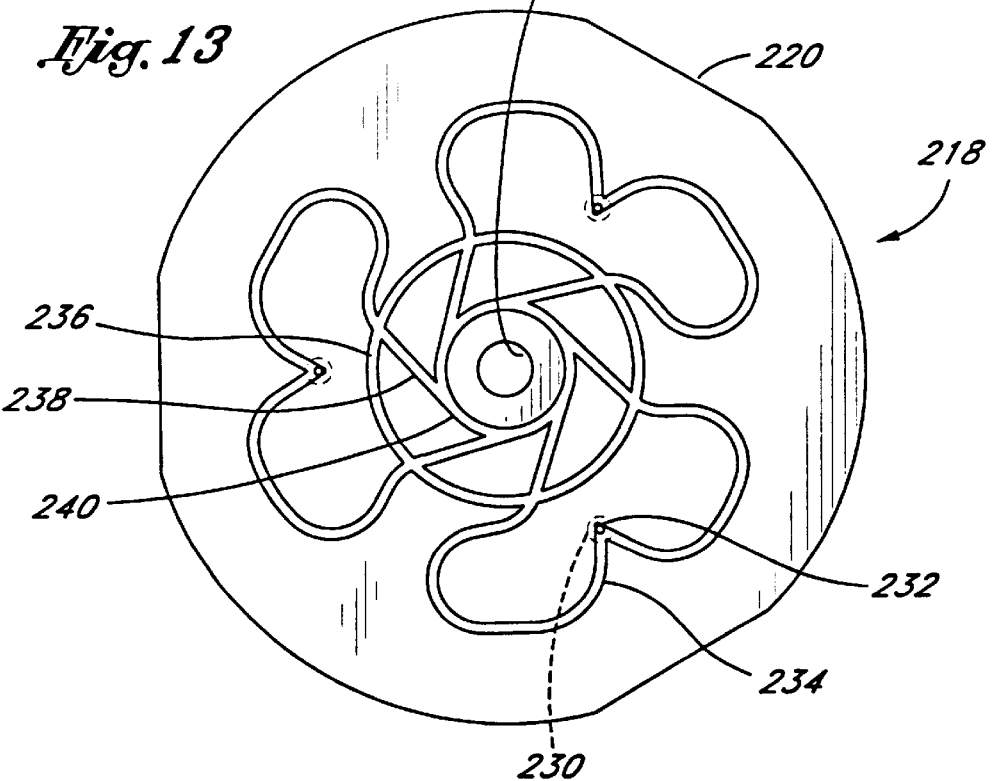
FIG. 13 is a top plan view of a bottom section of the segmented susceptor of the wafer support system of FIG. 11.

FIG. 11 illustrates in dashed line, an interface 219 between the top section 208 and a bottom section 218 of the segmented susceptor 202, the bottom section being seen in top plan view in FIG. 13. The outer periphery of the bottom section 218 is substantially circular, except for three flats 220 disposed at 120° intervals therearound. The outer periphery of the bottom section 218 fits within a similarly shaped lower step 222 of the top section 208, as seen in dashed line in FIG. 12, and in cross-section in FIG. 14. The flats 220 of the bottom section 218 cooperate with inwardly-facing flats 224 formed in the lower step 222 to rotationally orient the top section 208 with the bottom section 218. The bottom section 218 further includes a small central through bore 226 within which a downwardly depending hub or spindle 228 of the top section fits.

The underside of the bottom section 218 includes three shallow spider arm cavities 230, similar to those previously described. The cavities 230 communicate with vertical gas flow passages 232 leading to a plurality of gas distribution grooves 234 formed in the upper surface of the bottom susceptor section 218. As seen in FIG. 13, each gas flow passage 232 communicates with diverging grooves 234 which travel circuitous paths extending first radially outwardly, then circumferentially adjacent the periphery of the susceptor lower section, and finally generally radially inwardly toward the center of the bottom section 218. In this manner, sweep gas flows substantially through the entire susceptor in a generally axisymmetrical pattern to provide even heat transfer to the sweep gas from the hot susceptor, and visa versa.

Both gas distribution grooves 234 intersect a continuous outer circular delivery groove 236 concentrically formed in the bottom section 218. From the outer groove 236, a plurality of angled spokes 238 lead to an inner circular delivery groove 240, again concentrically formed in the bottom section 218. Although the gas distribution grooves 234 are shown continuing directly into each of the spokes 238, other arrangements are possible. Furthermore, the spokes 238 are shown intersecting the inner circular delivery groove 240 at generally tangential angles, but may also be connected at other more direct radial angles. The gas flow passages 232 are located radially outward from the sweep gas outlets 216 and the gas distribution grooves 234 desirably traverse a nonlinear path therebetween, preferably longer than a direct line between any of the passages 232 and outlets 216, and most preferably in a circuitous pattern such as the one shown.

The inner circular delivery groove 240 lies directly underneath the inner circle of sweep gas outlets 216 when the top section 208 is coupled over the bottom section 218. Likewise, the outer circular delivery groove 236 lies directly underneath the outer circle of sweep gas outlets 214. This arrangement allows for an even pressure and supply of sweep gas to all of the outlets 214, 216 in the top surface of the segmented susceptor 208. The pressure created between the top and bottom sections 208, 218, is reduced somewhat from previously described embodiments by the increase in the number of sweep gas outlets 214, 216, and by the reduction in size of the inlet gas flow passages 232. More specifically, the inlet gas flow passages 232 have a diameter of approximately 0.060 to 0.070 inches. FIG. 11 illustrates the gas flow from the passages 232 through the distribution grooves 234 with arrows 242.

In a departure from previous embodiments, and as seen in FIG. 12, each of the spacers 206 is supplied with purge gas from one of the gas distribution grooves 234 via a purge channel 244. These purge channels are seen in cross-section in FIG. 14 and extend from the respective gas distribution groove 234 directly to the spacer 206. In this manner, a continuous supply of purge flow, indicated at 246, is supplied to the regions surrounding each spacer 206. Each of the spacers 206 fits within an aperture 250 formed in the top surface of the recess 204. A clearance is provided between the spacer 206 and its aperture 250 so that the purge gas may flow upward therearound and protect the spacer from deposition gases. More particularly, when the wafer 248 is not present, the sweep gas through the outlets 214, 216 flows generally upward into the reaction chamber, rather than outward around each of the spacers. This leaves the spacers 206 unprotected from etch or capping gases. The spacer is defined by a lower cylindrical base 252 and upper elongated cylindrical pin 254 having a rounded upper surface. The pin portion 254 is undersized with respect to the aperture 250 to allow the purge flow 246 therethrough. In one embodiment, the pin 254 has a diameter of between 0.050 and 0.055 inches, while the aperture 250 has a diameter of between 0.062 and 0.067 inches.

The present invention provides a susceptor combination enabling selection of different upper sections depending on the wafer size to be processed. Such a combination is especially useful in the reaction chamber 20 having the support plate 32. As mentioned above, the susceptor preferably has a constant outer diameter to fit within the ring 62, and aperture 33 in the support plate 32. As the upper section defines the outer perimeter of the susceptor, it will by necessity have a constant diameter while the wafer recess varies in size to accommodate the different wafer sizes. The bottom shape of each of the upper sections is designed to mate with a single lower section, which reduces costs somewhat. FIGS. 11–17 illustrate four different susceptor combinations 200, 258, 278 and 300 for four different wafer sizes. Other sizes of wafers may of course be accommodated by such a combination, the maximum size only being limited by the outer diameter of the susceptor.

FIG. 15 illustrates a second version of a top section 260 of the wafer support system 200. The bottom section is the same as was described with respect to FIGS. 11–14. Indeed, an interface 262 between the top section 260 and the bottom section 218 is the same as previously described, and the gas distribution grooves 234 in the bottom section are in the same location. The top section 250 differs from the earlier described version by a reduced diameter recess 264. The recess 264 is defined by the circular step 266, which in turn creates a larger radial dimension for the ledge 268. The top section 260 is adapted to support smaller sized wafers within the recess 264. In this respect, a plurality of spacers 270 are positioned at 120° intervals around the center of the susceptor and at radial distances which provide adequate support for wafers of approximately 150 millimeters. To connect the purge gas grooves 234 with the spacers 270, shortened purge channels 272 are provided.

FIG. 16 illustrates a third version of a top section 280 of the wafer support system 200. Again, the bottom section is the same as before with the interface 282 between the top and bottom sections being the same. The top section 280 includes an enlarged ledge 284 terminating in a circular step 286. The recess 288 thus formed is sized to receive wafers of approximately 125 millimeters in diameter. Purge channels 288 lead to apertures surrounding the captured spacers 290 at radial dimensions sufficient to support the reduced-size wafers. It will be noted that the gas distribution grooves 234 extend radially outward from the recess 266, and then continue inward to the circular delivery grooves.

In a fourth version of the top section 302, seen in FIG. 17, the step 304 is even further moved inward, reducing the recess 306 to a size sufficient to support 100 millimeter wafers. Again, the interface 308 remains in the same location, as the bottom section of susceptor 300 is identical to that previously described. The outer ledge 310 is greatly enlarged in this embodiment. Three spacers 312 are provided at 120° intervals around the center of the susceptor, and three associated purge channels 314 connect the gas distribution grooves 234 thereto. It will be noted that the radial positions of the spacers 312 are within the circle created by the three gas inlet apertures in the bottom surface of the susceptor. Indeed, the gas distribution grooves 234 extend radially outward from the recess 306, and then continue inward to the circular delivery grooves. Furthermore, the location of the support arm-receiving cavities is just outside of the recess 306, and is thus outside of the wafer when positioned on the susceptor 300. The ledge 310 surrounding the recess 306 extends outward radially from the wafer for at least half the wafer diameter.

Figure 21A:
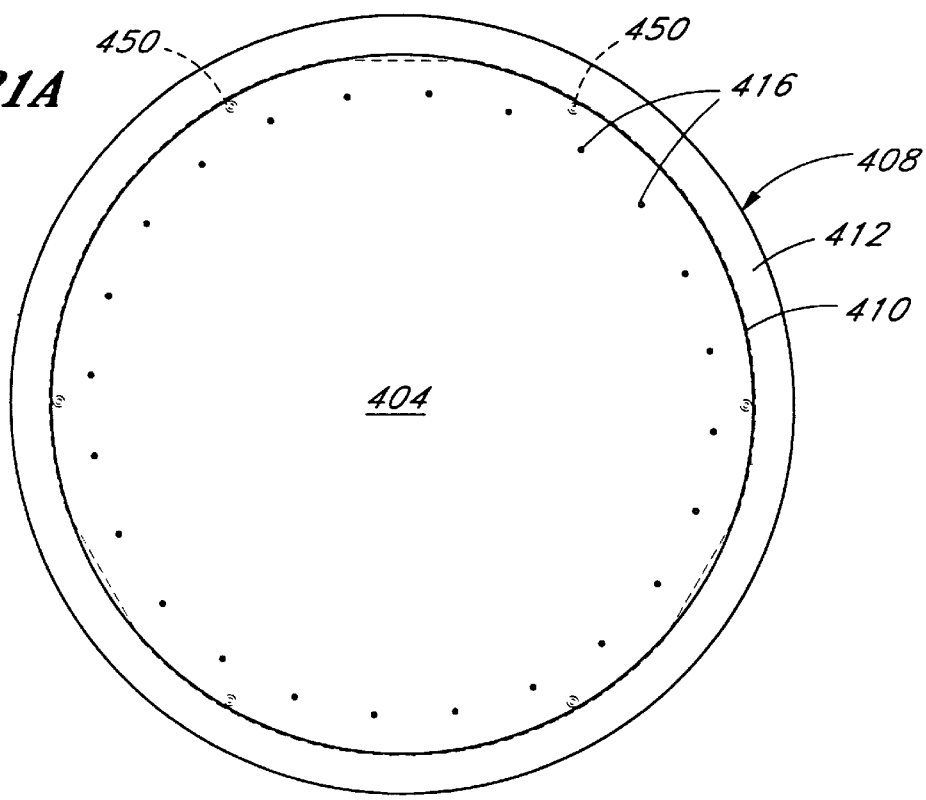
FIG. 21A is a top-plan view of the upper segment of another variation of segmented susceptor.

Referring now to FIGS. 21A–21E, there is illustrated another variation of a segmented susceptor. FIG. 21A illustrates a top section 408 having a shallow recess 404 defined around its outer perimeter by a circular step 410 leading to a ledge 412 which forms the uppermost surface of the susceptor. A circle of spaced sweep gas outlets 416 are located fairly close to the circular step 410. In the arrangement shown 24 outlets are provided. Positioned closer yet to the step is a circle of circumferentially-spaced support pin or spacer holes 450. With this arrangement, the wafer support pins or spacers will engage the undersurface of a wafer adjacent its outer periphery. Since a wafer typically has an alignment flat or notch on its outer periphery, six support pins are provided instead of three as in the earlier arrangements. Thus, even if a wafer alignment flat or notch is aligned with a support pin so that little or no support is provided by that particular pin, the wafer is still adequately supported by the other five.

Figure 21B:
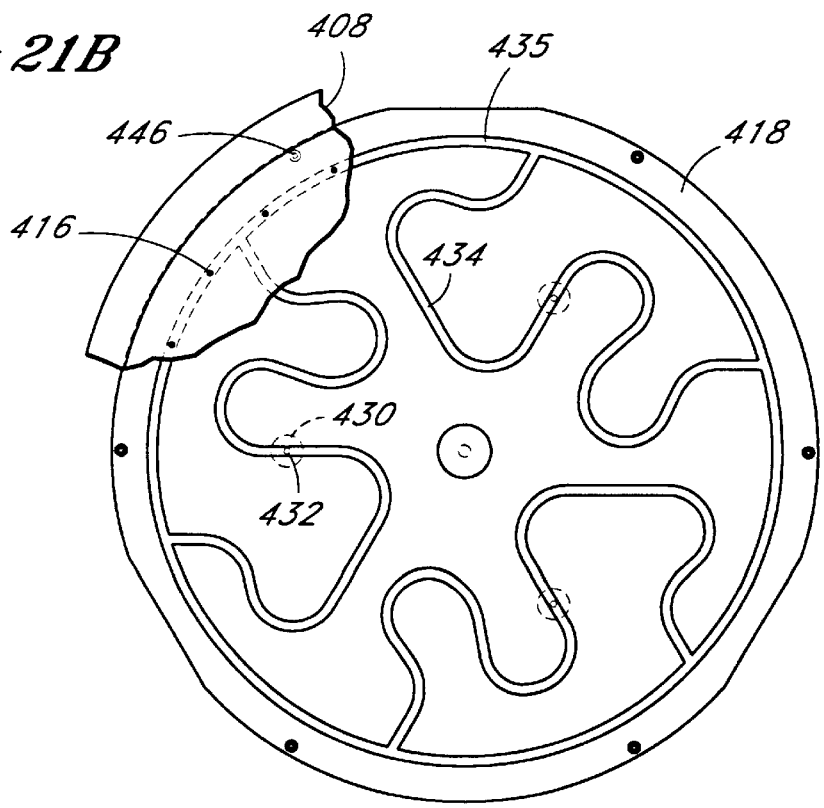
FIG. 21B is a top-plan view of the lower segment of a susceptor which mates with the upper segment shown in FIG. 21A, a portion of which is shown.

As seen in FIG. 21B, a susceptor lower segment 418 includes shallow spider arm cavities 430, similar to those previously described. The cavities communicate with vertical gas flow passages 432 leading to a plurality of gas distribution grooves 434 formed in the upper surface of the bottom susceptor section 418. As seen in FIG. 21B, each gas flow passage 432 communicates with groove sections which travel circuitous paths leading to an outer annular groove 435 at circumferentially spaced locations. One segment of each path first extends radially outwardly and then turns inwardly to form somewhat of a horseshoe shape, and then extends circumferentially and radially outwardly to form a second horseshoe-shaped portion before intercepting the outer groove 435. The other section of the path first extends radially inwardly and then curves radially outwardly and then circumferentially before intersecting the outer groove 435.

As seen from the fragmentary portion of the upper segment 408 in FIG. 21B and as further illustrated in FIGS. 21C, D, and E, the outer groove 435 is located beneath the circle of sweep gas outlets 416. By positioning the sweep holes so close to the outer periphery, the risk of backside deposition is greatly reduced. Further, the gas passages 434 together with the increased number of gas outlets 216 increases the sweep gas flow volume. Also, reducing the spacing between the periphery of the wafer and surrounding recess wall to about 0.10 inch further minimizes the possibility of deposition gas entering beneath the wafer.

By positioning the support pin cavities 430 adjacent the outer periphery of the recess in the susceptor, the upper surface of the wafer support pins 446 engage the lower surface of the outer periphery of a wafer 448 in an outer area referred to as an exclusion zone 449. This zone does normally not become a part of a semi-conductor circuit chip. Hence, any slight marking to the undersurface of a wafer that might be caused by a support pin is inconsequential.

Figure 21D:
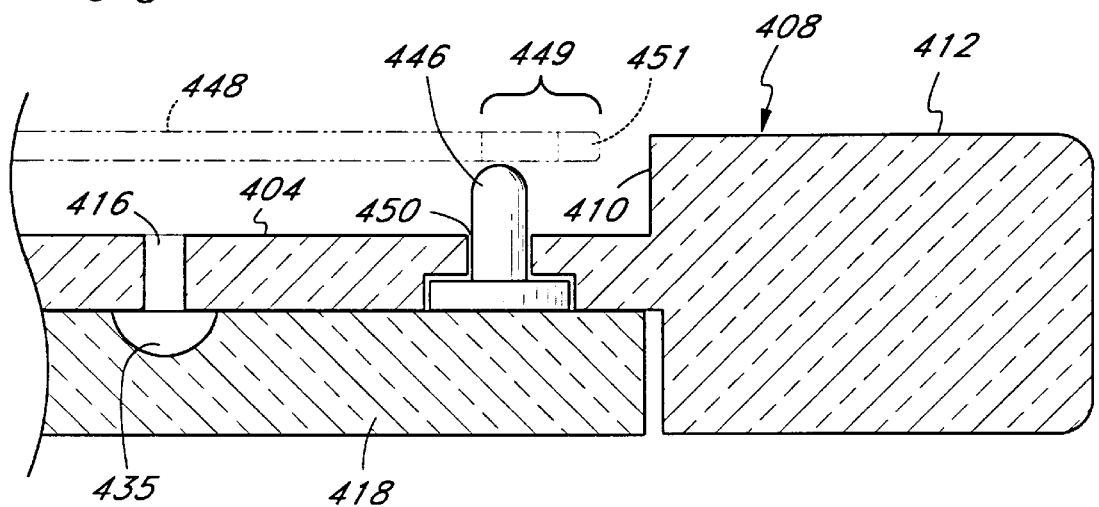
FIG. 21D is an enlarged cross-sectional view of one edge of the assembly of FIG. 21C illustrating more clearly the location of a support pin in reference to a wafer having a notch in its periphery.

FIG. 21D illustrates a situation in which the wafer is formed with an alignment notch 451. Even with that arrangement a pin will engage the wafer if the notch should happen to be aligned with wafer, so long as the wafer is centered and the gap between the wafer edge and the surrounding recess is small. In fact, with a small enough gap, the pin will engage the wafer even if not centered on the susceptor.

Figure 21E:
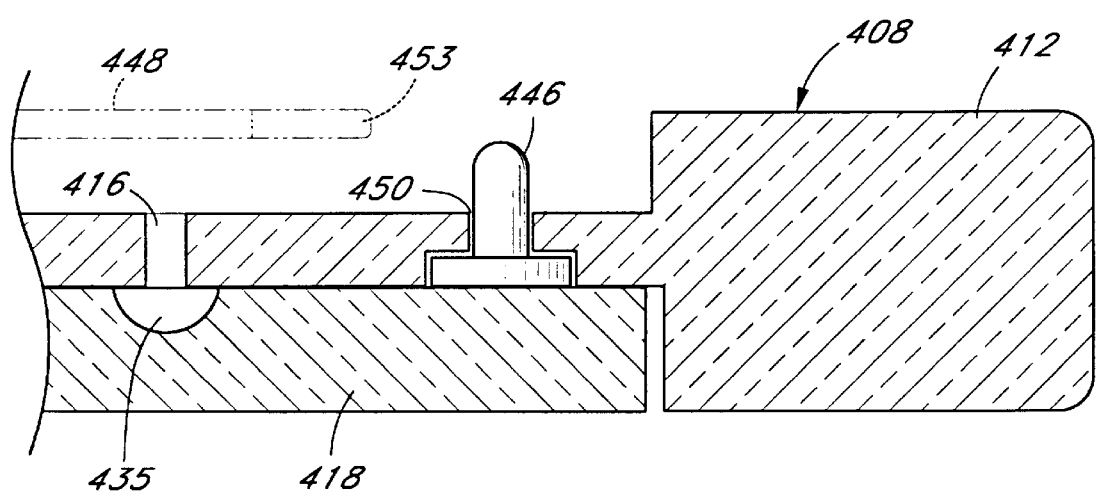
FIG. 21E is a view similar to that of FIG. 21D but illustrating a wafer having an edge alignment flat.

FIG. 21E illustrates the situation in which a wafer flat 453 is aligned with a support pin 446. As can be seen, the spacer pin is not actually engaging the wafer, but this is of no consequence since the wafer is supported by five other spacers.

Figure 22B:
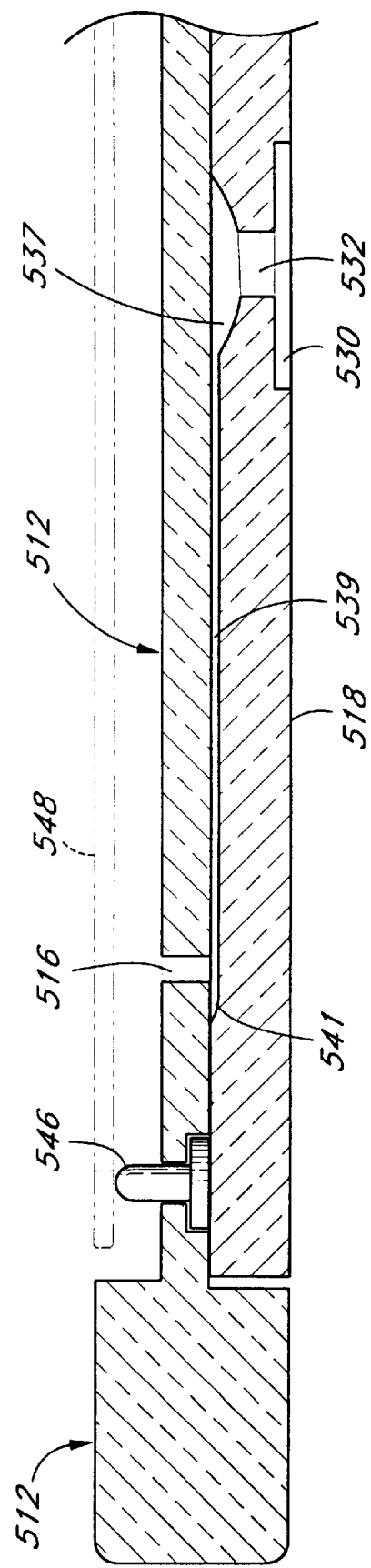
FIG. 22B is an enlarged cross-sectional view of a portion of the upper and lower segments of FIG. 22A assembled and supporting a wafer.

FIGS. 22A and 22B, show another segmented susceptor assembly wherein a lower susceptor section 518 is shown with a circular groove 537 which intersects three spider arm flow passages 532. A shallow annular recess 539 extends from the groove 537 out to a circular edge 541 close to the periphery 518A of the lower section. More specifically, the edge 541 is located just radially beyond a circle of circumferentially-spaced sweep gas outlets 516 adjacent the periphery of an upper susceptor segment 512, a fragment of which is shown in FIG. 22A. Six support pins 546 are also conveniently shown in FIG. 22A. The circle of outlets 516 shown in the arrangement of FIGS. 22A and B is essentially the same as that shown in FIG. 21A except that three times as many outlets are illustrated. Thus, in this arrangement, 72 outlets are utilized for a susceptor adapted to receive a 200 mm wafer 548. The exact number of the outlets can of course be varied, but it is advantageous having so many sweep gas outlets and having the shallow but large area annular recess 539 for feeding sweep gas to those outlets, as shown by the arrows in FIG. 22A. The increased gas flow greatly reduces the risk of deposition gas reaching the backside of the wafer.

Figure 23A:
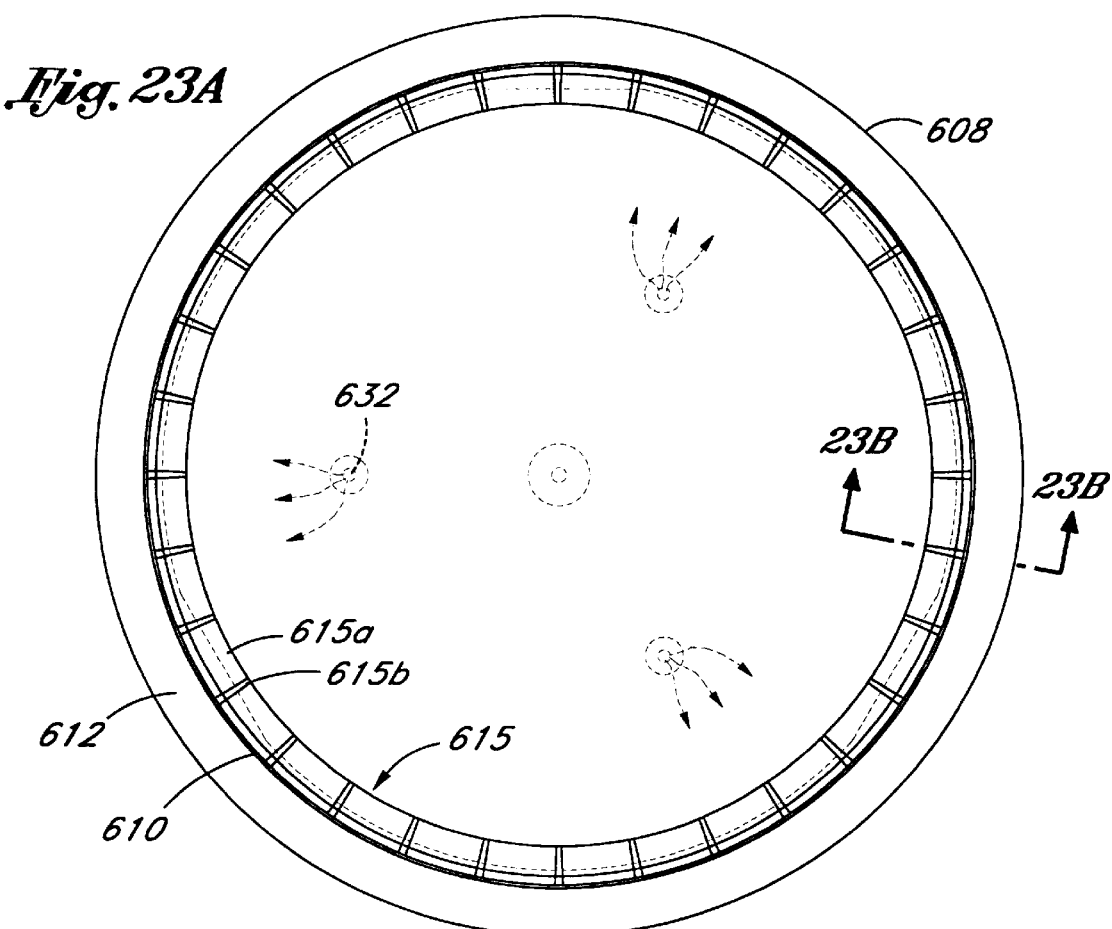
FIG. 23A is top-plan view of an upper segment of another susceptor with a wafer support ring mounted on the upper segment, and with a portion of a lower segment shown.
Figure 23B:
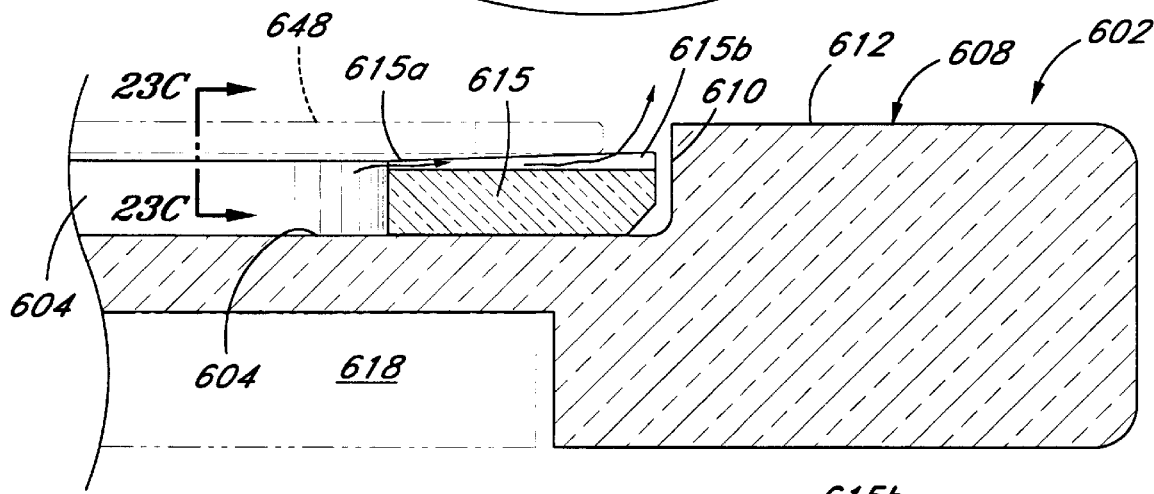
FIG. 23B is an enlarged cross-sectional view illustrating the relationship between the wafer support ring of FIG. 23A and a wafer.

FIGS. 23A, B, and C, illustrate arrangement which can be similar to any of the arrangements previously described except that it employs a spacer in the form of a ring rather than a plurality of pins. More specifically, there is illustrated a thin generally flat spacer ring 615 positioned in a shallow recess 604 in the top section 608 of a segmented susceptor 602. The outer perimeter of the ring 615 is located just within the edge of the recess as defined by a circular step 610 leading to a ledge 612, which forms the upper surface of the susceptor. The ring 615 extends inwardly to about the location occupied by the support pins in the arrangement of FIGS. 21 and 22. As seen from FIG. 23B, the upper surface 615a of the ring 615 is not quite horizontal. Instead, it slopes or angles downwardly in a radially inward direction. Thus, the radially outer portion is the thickest vertically. The vertical thickness of the ring in the area engaged by the wafer is equal to the height of the portion of support pins that protrude above the recess in the upper section of the susceptor in the above-described arrangements. The wafer is effectively thermally decoupled from the susceptor and suitably positioned with respect to the upper surface of the outer ledge of the susceptor. With only the outer perimeter of the lower surface of the wafer 648 engaging the ring 615, the ring avoids or minimizes any markings on the backside of a wafer. Moreover, any insignificant effect would be within the wafer exclusion zone and be confined to the edge profile of the wafer.

A plurality of radially extending passages or grooves 617b are formed in the upper surface of the spacer ring 615. Thirty-two passages are illustrated in a susceptor for receiving 200 mm wafers. As seen from FIG. 23A, these passages are circumferentially-spaced and provide outlets for the sweep gas, as shown by the arrows in FIG. 23B. The ring body between and around those passages blocks deposition gas flow into the backside of the wafer.

Figure 23C:
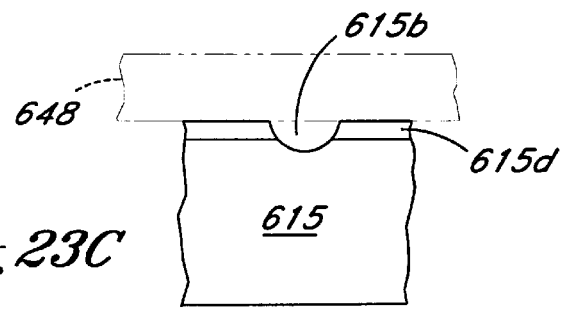
FIG. 23C is an enlarged fragmentary view illustrating the cross-section of the sweep gas passages in the support ring on FIGS. 23A and 23B.

FIG. 23C illustrates a semi-circular cross-sectional shape of the passage 615b, but of course other configurations may be employed. The cross-sectional area and the number of passages are selected to provide the desired flow, consistent with gas provided through passages 632 in a lower susceptor section 618, seen in FIG. 23B. The passages 632 are shown for convenience in FIG. 23A even though no other details of a lower susceptor section are shown. As mentioned above, any of the sweep gas arrangements described above may be employed with the ring concept of FIGS. 23A–C. In fact, the support ring can be employed with upper susceptor segments designed to receive support pins inasmuch as the pin holes do not interfere with the use of the ring and do not have a significant effect on the sweep gas system. Thus, a user can employ either approach.

The ring can be conveniently made of the same material as the support pins or the susceptor.

In testing the wafer support system described above, it has been learned that certain aspects of the reactor system are particularly important in obtaining satisfactory results. FIG. 18 illustrates a rectangular chamber having a flat upper wall 324 and a flat lower wall 325 in an inlet section and a flat lower wall 326 which is stepped down from the wall 325 by a flat vertical wall 327. The horizontal walls 324, 325 and 326 are joined by flat vertical side walls 328 and 330 to create a chamber having a shallow rectangular inlet section and a deeper rectangular section adjacent to it in which is positioned a susceptor 382 and a temperature compensation ring 362.

Figure 19:
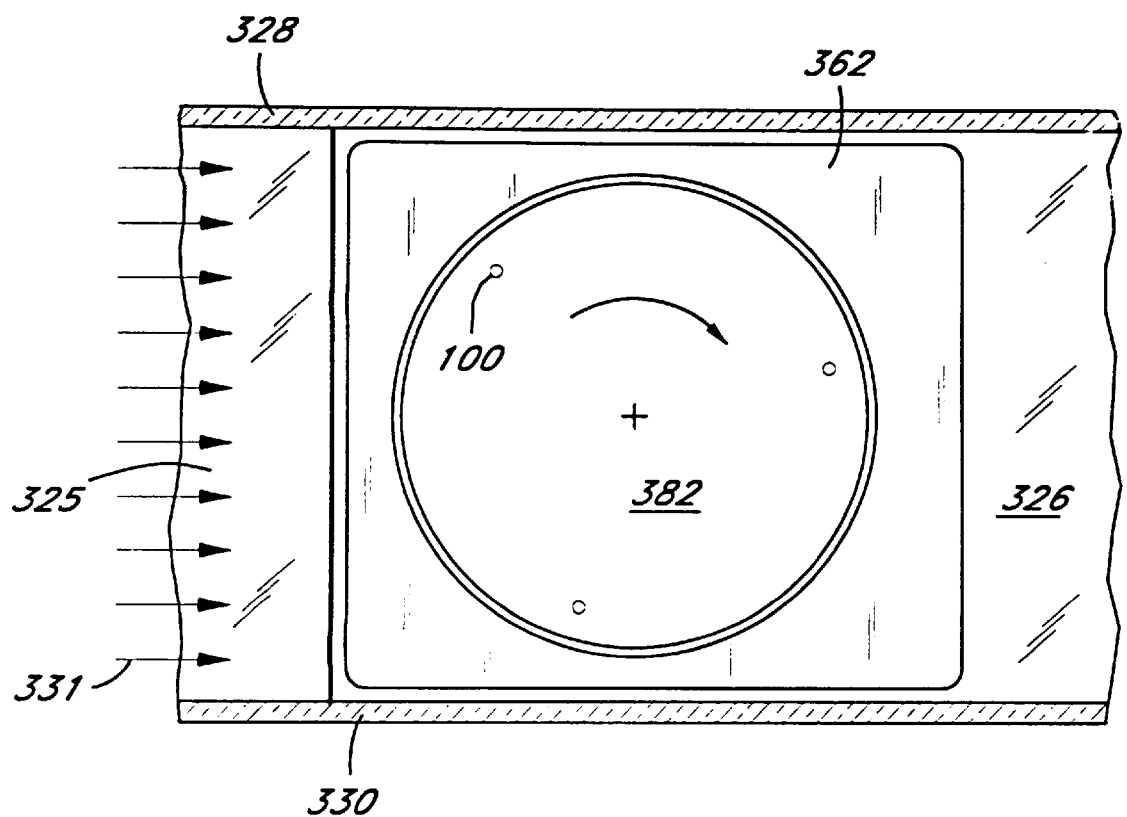
FIG. 19 is a top plan view of the chamber of FIG. 18.

It is preferred that the ring 362 surrounding the susceptor have a generally rectangular exterior shape as shown in FIG. 19. Further, it is also desirable that the radiant heating lamp banks 351 and 352 above and below the upper and lower walls 324 and 326 of the quartz chamber in FIG. 18 define an exterior shape that is generally rectangular and conform to that of the ring, so that the projected radiant heat pattern or column is likewise generally aligned with the ring. That is, the heat is primarily directed to the ring and the susceptor area rather than being directed to the quartz walls adjacent the ring. This heating arrangement is highly efficient and promotes uniform temperature and deposition across the ring and the susceptor. Incidentally, the spot lamps 353 beneath the central portion of the susceptor are considered to be part of the lower lamp bank 352.

The ring is supported on a suitable quartz stand 356 resting on the bottom of the chamber. Alternate supporting arrangements may be employed such as utilizing ledges or fingers extending from the adjacent quartz structure. This configuration of the ring and the radiant lamps has been found to work particularly well in a chamber having a generally rectangular cross section formed by the flat upper and lower walls 324 and 326 and vertical side walls 328 and 330.

The combination of the rectangular chamber and the rectangular ring simplifies the process gas flow across the wafer. With the rectangular ring, the process gas introduced through an injector such as at 46 in FIG. 1, is depleted generally uniformly across the width of the chamber such that the velocity profile of the process gas may be generally uniform across the chamber as schematically indicated by the arrows 331 in FIG. 19. Consequently, a minimum of carrier gas is required with the rectangular ring and the rectangular chamber cross section, since there is no need to increase flow in the center. The reduced carrier gas flow means less cooling effect on the wafer. This is important for a wafer spaced from the susceptor, since the spaced wafer is more responsive to the cool gas flow than is a wafer supported directly on the susceptor. The volume of hydrogen gas has been reduced by about 75% in a prototype system. Stated differently, the ratio of the carrier gas to the deposition gas has been reduced from a minimum of about 15 to 1 to a minimum of about 5 to 1.

With the wafer substantially thermally decoupled from the susceptor, it has been found to be quite sensitive or responsive to nonuniformity in the heat output of the lamp banks. For example, the spacing between the lamps and the distance of the lamp banks from the wafer and the susceptor 382 affect the uniformity of the heat pattern obtained on the wafer. Thus, with the wafer spaced from the susceptor 382, it has been found desirable to increase the distance between the wafer and the upper lamp bank 351 from that employed with a wafer positioned directly on the susceptor. Likewise, it has been found desirable to increase the distance from the susceptor to the lower lamp bank 352. But it has been found desirable to increase the space between the wafer and the upper lamp bank 351 more than the space between the lower lamp bank 352 and the susceptor.

Common to all the various arrangements disclosed, the wafer is supported in a reactor largely thermally decoupled from the susceptor. That is, the wafer is supported on spacers or pins that space the wafer a substantial distance above the susceptor. The pins have minimal contact with the wafer. The sweep gas is preheated by way of the novel susceptor design so that it has an insignificant effect on the temperature of the wafer but yet effectively prevents process gases from depositing on the backside of the wafer. Since the wafer is essentially decoupled from the susceptor, the wafer can heat more quickly as compared to a system wherein the wafer is in contact with the susceptor.

The lamp banks 351 and 352 are controlled by a suitable electronic controller schematically shown at 390 in FIG. 18. The controller includes a transmitter component that receives signals from the temperature sensors in the ring surrounding the susceptor and from the sensor located at the center of the lower side of the susceptor. These temperature signals are transmitted to heater control circuitry. Additionally, temperature control information such as various temperatures settings desired for a particular deposition cycle is inputted to the heater control circuitry. That information is then processed by the control circuitry, which generates control signals that control power to the heating assemblies. Further details of such a system, are disclosed in U.S. Pat. No. 4,836,138, which is expressly incorporated herein by reference.

In that earlier system, some lamps from the upper and lower lamp banks are controlled together as a zone that would be adjusted as a unit. That is, the power ratio was fixed so that if the power was increased to a lamp in the upper bank, a corresponding power increase was provided to a lamp of that particular zone in the lower bank as well. The ratio is advantageously fixed by applying the temperature control signal for a given lamp bank through a pre set ratio potentiometer that modifies the control signal before it is applied to the lamp bank. The other lamp banks advantageously have their control signals modified using similar ratio control circuitry, there by providing a pre set power ratio between the lamp banks within a zone. In this way the various zones can be adjusted independently. One change to the system described in U.S. Pat. No. 4,838,138 has been made as a result of the wafer on spacers design. An analog ratio control has been added to the circuitry to permit the lamp bank power ratio between the upper and lower lamps of a particular heating zone to be adjusted at various points during the process as a result of the thermal decoupling of the wafer from the susceptor. This is advantageously accomplished in the current system by adding a dynamically controllable ratio potentiometer in series with the pre set ratio potentiometer for the lamps in the upper lamp bank within a zone. Thus, the control signal for the upper lamp bank within the zone may be changed using the dynamically controllable potentiometer. Because the total power applied to the lamps in that zone remains about the same, when the power to the upper bank lamps within the zone is changed, the power to the corresponding lamps 352 in the lower bank is changed in the opposite direction. Thus the power ratio between the two is changed. This enables the temperature of the susceptor and the wafer to be maintained close together even though they are physically spaced.

Referring more specifically to the heating system disclosed in U.S. Pat. No. 4,838,138, lamps 48B and 48C of FIG. 6 form a central heating portion of an upper lamp bank, and the lamps 78B and 78C form a central portion of a lower bank. The ratio of power between the upper and lower banks was changed utilizing the analog ratio control by changing the power applied to the upper bank lamps 48B and 48C, while the total power applied to the lamps 78B, 78C, 48B and 48C remains about the same. This results in a change to the power to the lower bank in the opposite direction.

Figure 20:
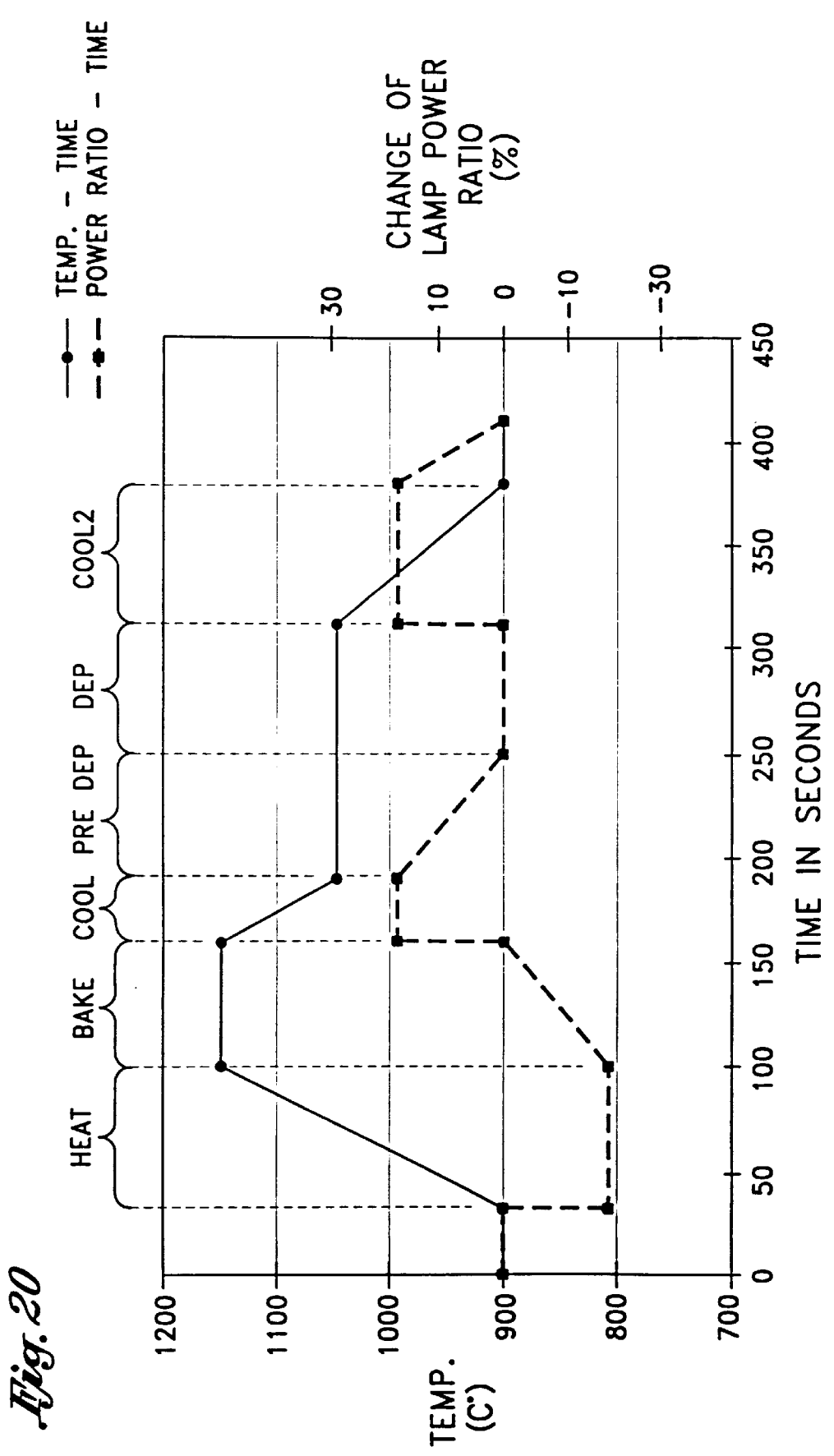
FIG. 20 is a graph showing changes in lamp power ratio during a deposition cycle.

An example of utilizing the analog ratio control is illustrated in the graph of FIG. 20. The solid line illustrates a time temperature recipe for the processing of a semi-conductor wafer. The solid line indicates a wafer being loaded into a reactor with the lamps set to provide a starting temperature of 900° C. The temperature is maintained at that level for about 30 seconds. Additional heat is then applied ramping the temperature up to about 1150° C. in about 70 seconds. The wafer is then subjected to a bake or etch step at that level for about a minute. The temperature is then allowed to decrease to a deposition temperature of about 1050° C. with the cooling occurring in about 30 seconds. The temperature is maintained at 1050° C. for about 70 seconds in a predeposition phase followed by about 70 seconds while the deposition is occurring on the wafer. The wafer is then allowed to cool to about 900° C. for a similar time. The cycle is then complete and the wafer is removed at the 900° C. level.

As explained above, the ratio of the heat between an upper bank of lamps and a lower bank of lamps has been kept at a predetermined ratio when the wafer being processed is supported directly on the susceptor. That method is satisfactory with the wafer positioned on the susceptor inasmuch as the temperature between the susceptor and the wafer are largely the same throughout the cycle. However, with the wafer spaced above the susceptor, it is desirable to change the ratios between the upper and lower heating banks in the central portion of the wafer during the cycle. The broken line of FIG. 20 provides an example of the analog ratio control. The ratio percentage change is illustrated on the right-hand scale of the chart of FIG. 20. At the start of the cycle, the ratio is shown at a zero percentage variation, meaning that the lamps are at what might be termed a steady state condition or the fixed ratio position. This does not mean that the power between the upper and lower banks is necessarily the same. As an example of an operating system the upper lamps received about 48% of the power and the lower lamps about 52%. With a wafer supported in direct contact with a susceptor, the power ratio would simply remain on the zero or steady state line. However, that is not satisfactory with the wafer spaced from the susceptor.

It is desirable to maintain the temperature between the wafer and the susceptor approximately the same during the heating cycle. Since the wafer is spaced above the susceptor and has less mass than the susceptor, it heats more quickly then the susceptor. Thus, the percentage of heat required by the wafer is reduced during the phase of the cycle in which the temperature is ramped up from 900° C. to 1150° C. Thus, the broken line of the graph shows that the percentage of power applied to the upper lamps is decreased to a ratio about 20% below the steady state or zero change condition. As mentioned above, the total power applied to the lamps is about the same as it would be if the ratio were not changed, and hence, this results in an increase in the percentage of the power being applied to the lower lamps. With this changed ratio, the temperature of the wafer and the susceptor remain substantially the same as the temperature is ramped up to the 1150° C. level. While the temperature is maintained at that level for the bake or etch phase, the variable ratio control is returned to the zero or steady state ratio as shown on the graph.

When it is then desirable to cool the wafer from 1150 to 1050° C., the power is reduced; but some power is continued to control the cooling. Since the wafer spaced from the susceptor cools more quickly than the susceptor, the ratio between the upper and lower lamps is changed by reducing the power to the upper lamps a lesser percentage than to the lower lamp to maintain the wafer at the susceptor temperature. As shown on the broken line, the percentage of power to the upper lamp is increased so that the ratio is increased by about 20% to the upper lamp. While the wafer is maintained at that 1050° C. level, the power ratio is returned to the steady state condition so that at the time that the predeposition phase is over and the deposition phase is to commence, the power ratio is at the so-called steady state condition. After deposition, it is desirable to allow the wafer to cool to the 800° C. level; and hence again, the ratio is changed by increasing the percentage of the power to the upper lamps by about 20%. When the 800° C. level is reached, the power percentage is decreased with respect to the upper lamp, allowing the ratio to return to its steady state condition. It should be kept in mind that the total power applied is approximately the same and it is only the power ratio between the upper and lower banks which is being altered. The actual percentage changes, of course, have to be determined for the particular wafers being processed and the particular temperatures and processes involved. The analog ratio control feature employs multiplier circuits to modify the power signal to the upper lamps by the appropriate fraction to obtain the desired result.

Figure 24:
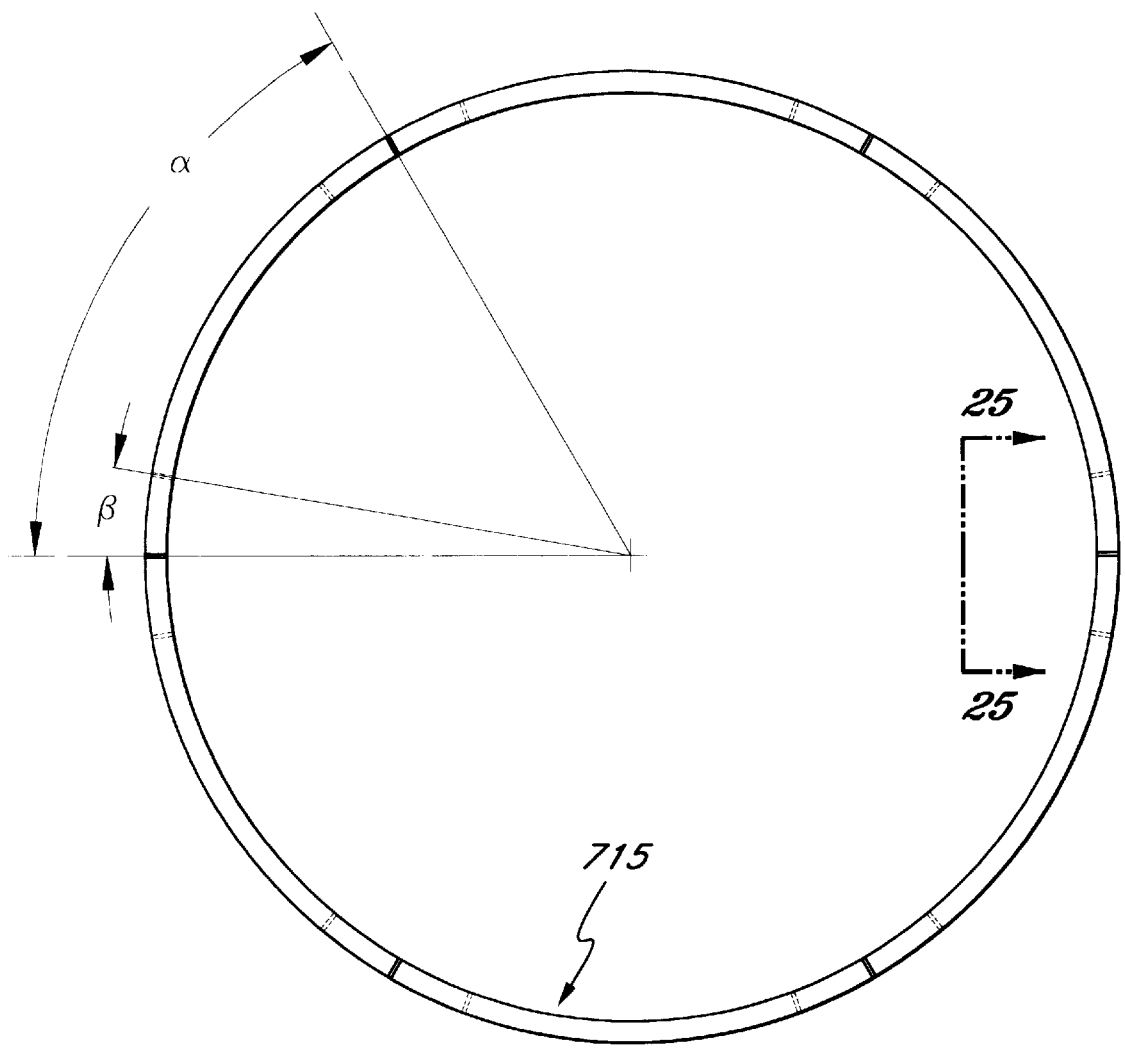
FIG. 24 is a plan view of another embodiment of a spacer or blocker ring.

FIGS. 24 and 25 illustrate an arrangement similar to that in FIGS. 23A, B and C, but it includes a spacer ring 715 having a configuration different from the spacer ring 615. Instead of being a flat ring with a plurality of circumferentially spaced grooves 615b in its upper surface, the ring 715 includes a central main body portion 715b having a generally flat rectangular cross-section, as best seen in FIG. 25B. A plurality of lands, lips or projections 715a extend upwardly from the main body portion 715b to form spacers for the substrate. In the arrangement shown in FIG. 24, six such lands are provided, circumferentially spaced at an equal angle α of approximately 60°. As seen from FIG. 25A, the lands extend the complete radial thickness of the ring, but the upper surface of the land 25b is slightly sloped from a radially outer edge to a lower radially inner edge of the ring. This arrangement minimizes the contact between the substrate 648 to a very slight line contact at the six land locations. Further, as can be seen from FIG. 25, the circumferential width of the land is very small, preferably only about 0.030 of an inch. The slope of the upper surface of the land is only about 2° from horizontal. Projections or protuberances with other configurations can be employed instead of the lands.

The ring 715 is further provided with a plurality of feet 715c depending from the main body portion 715b at circumferentially spaced intervals. More specifically, it can be seen from FIG. 24 that a pair of such legs straddle a land 715a and are spaced from the land a circumferential angle β of about 10°. This creates a total of 12 feet, two adjacent each side of each land 715a. As seen from FIGS. 25A, 25B and 25C, the feet extend the full width of the main ring body 715a, except that the outer lower corners of the feet 715c are chamfered.

Spacers supporting a wafer above a susceptor have less resistance to thermal transport than the gas between the wafer and the susceptor. Thus, undesirable thermal gradients can be created within the wafer near the contact area. This is most significant with larger thermal gradients that may occur during rapid heat ramp-up of the system. An advantage of having a land 715a circumferentially spaced from a foot 715c is that the thermal path between the susceptor and the wafer is much longer than that with a spacer extending directly between the two components. Or, stated differently, the thermal path from the bottom of one foot to the top of an adjacent land is much greater than the height of the ring including the foot and the land. This in turn permits rapid heating of a system, which of course improves productivity.

With the arrangement illustrated in FIGS. 24 and 25, the remainder of the susceptor can be formed utilizing any of the susceptor configurations of FIGS. 2–17, with or without spacer pins. That is, if the spacer ring is provided with a height equal to that of the spacer pins, the spacer pins need not be employed. Alternatively, the total height of the blocker or spacer ring can be slightly less than that of the spacer pins such that the substrate is supported by the spacer pins.

Various dimensions of the spacer ring 715 may be employed. For example, the height A of the land 715a in one prototype version for an 8 inch wafer is approximately 0.022 of an inch, with the central body portion being about 0.035 of an inch, and the feet being about 0.020 of an inch, for a total of about 0.077 of an inch. The thickness B of the central body portion 715b can be increased to decrease the area of the passages between the lands and between the feet. In another configuration, the main body portion 715b is about 0.045, with the projection 715a being about 0.017 and the foot being about 0.015. It should be noted that since the diameter of the substrate is slightly less than the outer diameter of the ring, the height of the land 715a at the area contacted by the periphery of the substrate is about the same as the height of the foot. In another configuration, the central body portion 715b is about 0.055 of an inch, with the upper and lower portions being about 0.010 of an inch each. In yet a fourth configuration, the central body portion was about 0.065 of an inch, with the upper and lower projections being only about 0.005. Thus, it can be seen by varying the dimensions of the ring, the cross-sectional area of the passages between the ring and the substrate, and the ring and the susceptor, are correspondingly varied.

Figure 26:
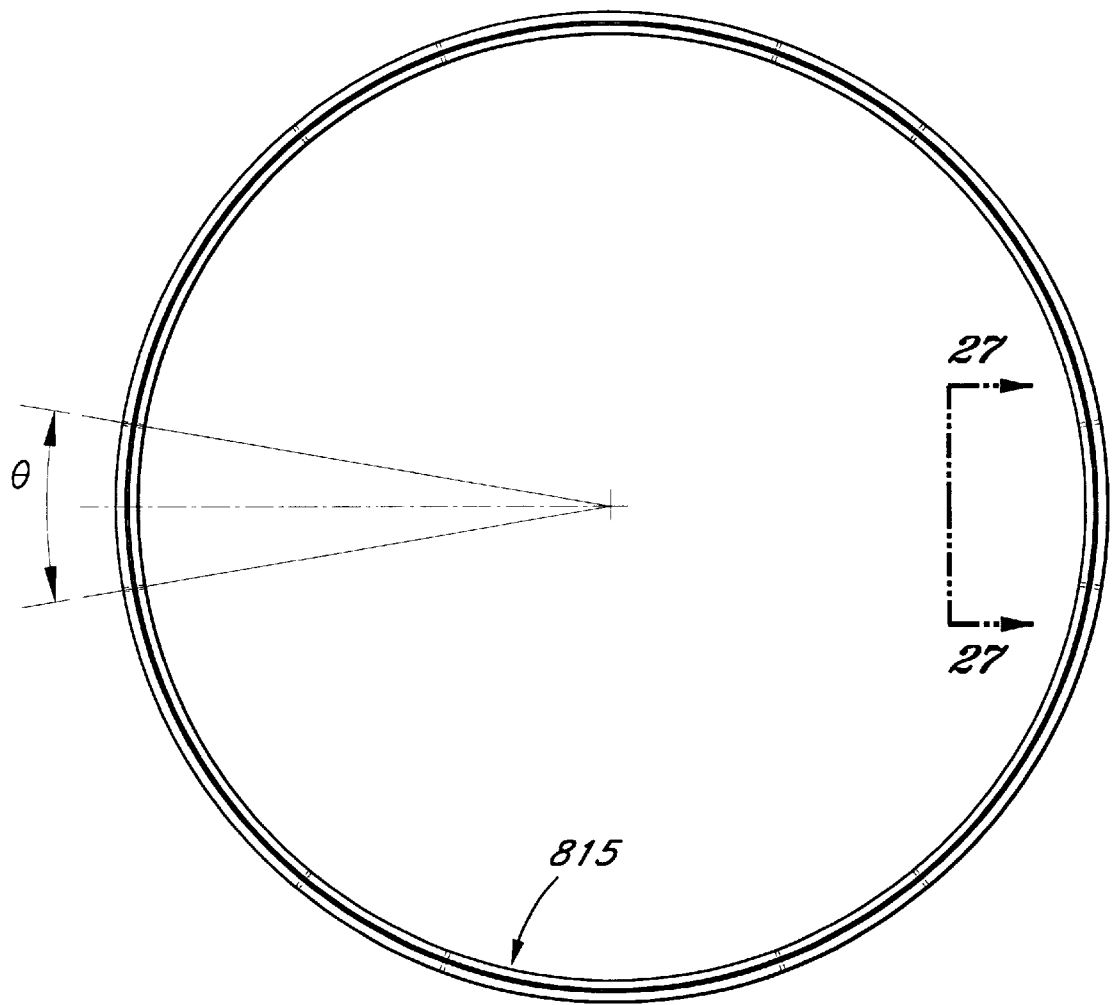
FIG. 26 is a plan view of another embodiment of a blocker ring.

FIGS. 26 and 27 illustrate another configuration of a spacer or blocker ring 815. As seen from FIGS. 26, 27, 27A and 27B, the ring includes a main body portion 815b having a generally rectangular cross-section, and includes an upwardly extending continuous annular rib 815a which is positioned approximately midway between inner and outer diameters of the ring. The ring is further provided with a plurality of circumferentially spaced feet 815c that depend from the main body portion 815b. These feet are approximately the same as the feet 715c illustrated in FIG. 25. That is, in the arrangement illustrated, a pair of feet 815c are spaced from each other at an approximate angle θ of about 20°. Further, there are six pairs of such feet circumferentially spaced approximately 60°, thereby creating a total of 12 feet.

The ring 815 is preferably used as a blocker ring in which the overall height of the ring is less than that of the support pins or spacers discussed above, so that the substrate is supported on the spacer pins rather than the blocker ring. In that sense, the ring 815 serves only to block the inward flow of deposition gas and to further improve the action of the sweep or purge gas by providing a thin annular passage or slit of only about 0.010 of an inch between the upper edge of the rib 815a. Also provided are circumferentially spaced, vertically short passages between the feet 815c. In a preferred arrangement, the height $A^1$ of the rib 815a is about 0.025 of an inch, the main body height $B^1$ is about 0.030 of an inch, and the height $C^1$ of the foot is about 0.010 of an inch for a total of about 0.065. When used with spacer pins that create a gap of 0.075 inch, this created the 0.010 inch passage between the rib and the substrate.

The radial dimension or width of the annular rib 815a is preferably about 0.025 inch; and as seen in FIG. 27B, it has a generally flat central portion with rounded shoulders.

To further block the gap between the substrate and the susceptor, the blocker ring feet 815c may be eliminated, creating a cross-section illustrated in FIG. 27C, wherein the main body portion is about 0.040 inch.

Figure 28:
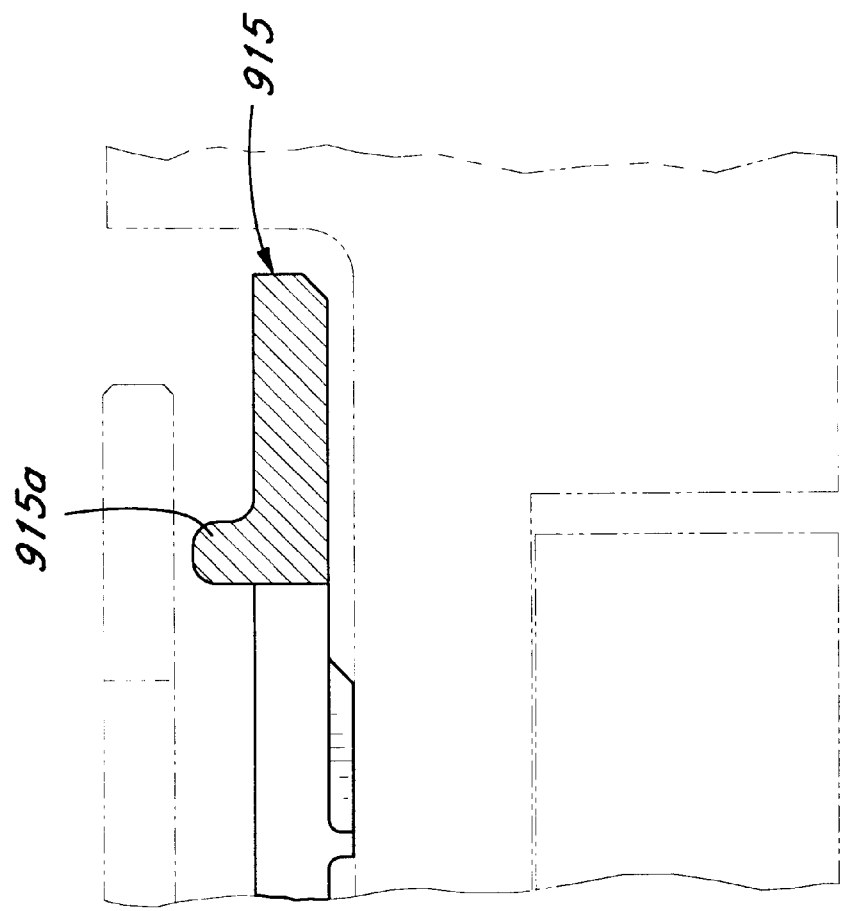
FIG. 28 is a cross-sectional view of an alternative blocker ring configuration.

FIG. 28 shows a blocker ring 915 having a cross section similar to the ring 815 accept that an annular rib 915a is located adjacent the inner diameter of the ring, thus giving the ring cross section somewhat of an L shape, with the radial dimension of the ring representing the long leg of the L shape and the upwardly extending rib representing the shorter leg.

An advantage of the arrangement illustrated in FIGS. 26, 27, and 28 is that with the ribs 815a and 915a spaced from the substrate, the ring is substantially thermally decoupled from the susceptor so that there are no significant temperature discontinuities in the area of the susceptor above the ring that might create slip. At the same time, since a substantial portion of the gap is blocked by the ring, deposition gas is blocked from entering the area beneath the substrate. Related to that is the fact that the velocity of the sweep gas is increased as it passes by the ring, which further inhibits the flow of deposition gas beneath the substrate. The input gas flow into the gap from the passages through the support spider can be controlled to create the desired flow and a pressure is maintained in the gap between the susceptor and the substrate that is greater than the pressure above the substrate. This pressure differential, of course, maintains the flow of purge gas or sweep gas and prevents the flow of deposition gas on the backside of the substrate. The use of a blocker ring, such as in FIGS. 23–28, provides good backside protection for the wafer with less gas flow than without the ring. Gas flow at various low flow rates has provided good results.

While some of the spacer rings are described as having feet or legs projecting downwardly from a main body portion, the susceptor could be provided with lips or bumps in those areas to create passages with the ring being flat or having feet. Similarly, while it is most practical to have a space ring or spacer legs formed separately from the susceptor, similar structures could be formed integral with the susceptor.

Also, while the completely ring shaped blockers discussed above are the currently preferred shape, blocker that does not extend completely to a closed 360° shape would be utilized. Similarly, a ring could be made as two or more separate pieces that could substantially form a ring would be useful. In addition a blocker not completely circular could be used. Other such changes are also included to come within the scope of the appended claims.

Although this invention has been described in terms of certain preferred embodiments, other embodiments are also within the scope of this invention. For example, although some of the illustrated embodiments are described for specific sizes of wafers, the same features may also be used to accommodate larger wafers. Indeed, wafers of 300 mm or larger are presently contemplated to supplement traditional 200 mm and smaller sized wafers. With larger wafers it may be desirable to employ additional spacers in a ring spaced radially inwardly from the three spacers 100 shown in FIG. 18, and offset circumferentially to be between the spacers of FIG. 18.

What is claimed:

1. An apparatus for processing a generally planar substrate comprising:
    a susceptor having an area for receiving said substrate in a generally horizontal orientation;
    one or more spacers extending above the susceptor to support the substrate and form a gap between the substrate and the susceptor;
    one or more passages in said susceptor for introducing sweep gas into said gap to flow radially outwardly from beneath the substrate; and
    a blocker ring supported on said susceptor at the periphery of said area to be beneath an outer annular portion of the substrate, the ring being configured to block radial flow of sweep gas and block deposition gas from flowing into said area, wherein the ring is configured to create a thin annular purge gas passage between the ring and the substrate.

2. The apparatus of claim 1, wherein said ring has a thin generally rectangular cross-section.

3. The apparatus of claim 2, wherein said ring has an annular rib extending upwardly from a main body portion of the ring.

4. The apparatus of claim 3, wherein said rib is approximately centered between inner and outer diameters of the ring.

5. The apparatus of claim 4, wherein the rib has a generally flat upper surface with rounded corners.

6. The apparatus of claim 5, wherein said rib flat upper surface is about 0.020 inches in radial dimension.

7. The apparatus of claim 5, wherein said rib flat upper surface has a radial dimension which is about a third of the radial dimension of the rib.

8. The apparatus of claim 2, wherein said rib is located adjacent the inner diameter of the ring, thereby making the ring cross section approximately L-shaped.

9. An apparatus for processing a generally planar substrate comprising:

a susceptor having an area for receiving said substrate in a generally horizontal orientation;

one or more spacers extending above the susceptor to support the substrate and form a gap between the substrate and the susceptor;

one or more passages in said susceptor for introducing sweep gas into said gap to flow radially outwardly from beneath the substrate; and a blocker ring supported on said susceptor at the periphery of said area to be beneath an outer annular portion of the substrate, the ring being configured to block radial flow of sweep gas and block deposition gas from flowing into said area, wherein said ring has a plurality of circumferentially spaced legs which create a plurality of circumferentially spaced passages between the ring and the susceptor, whereby restricted sweep gas flow is permitted above and below the ring.

10. The apparatus of claim 9, wherein said gap is about 0.075 of an inch and said ring is about 0.065 of an inch in vertical dimension.

11. The apparatus of claim 9, wherein said susceptor has a shallow recess which forms said substrate receiving area.

12. An apparatus for processing a generally planar substrate comprising:

a susceptor having an area for receiving said substrate in a generally horizontal orientation;

one or more spacers extending above the susceptor to support the substrate and form a gap between the substrate and the susceptor;

one or more passages in said susceptor for introducing sweep gas into said gap to flow radially outwardly from beneath the substrate; and a blocker ring supported on said susceptor at the periphery of said area to be beneath an outer annular portion of the substrate, the ring being configured to block radial flow of sweep gas and block deposition gas from flowing into said area, wherein said spacers are integral with said ring extending upwardly from a main body portion of the ring to create circumferentially spaced passages between the ring and the substrate.

13. The apparatus of claim 12, wherein said ring includes a plurality of circumferentially spaced legs depending from a main body portion of the ring, thereby creating a plurality of circumferentially spaced passages between the ring and the susceptor.

14. The apparatus of claim 13, wherein said spacers are circumferentially spaced from said legs so that a thermal path between the bottom surface of a leg and the top surface of an adjacent spacer is greater than the height of the ring including the spacer and the leg.

15. An apparatus for processing a generally planar substrate comprising:

a susceptor having an area for receiving said substrate in a generally horizontal orientation;

one or more spacers extending above the susceptor to support the substrate and form a gap between the substrate and the susceptor;

one or more passages in said susceptor for introducing sweep gas into said gap to flow radially outwardly from beneath the substrate; and a blocker ring supported on said susceptor at the periphery of said area to be beneath an outer annular portion of the substrate, the ring being configured to block radial flow of sweep gas and block deposition gas from flowing into said area, wherein said susceptor includes a substantially disk-shaped lower section and a substantially disk-shaped upper section, having a lower surface in engagement with an upper surface of said lower section, said one or more gas passages being defined by engaging surfaces of said sections, one or more gas inlets in said lower section opening to its lower surface in said passages, and one or more gas outlets in said upper section opening into said gap.

16. The apparatus of claim 15, including a support for said susceptor, having a central shaft and a plurality of support arms extending radially and upwardly from said shaft, with the arms having upper ends adapted to engage the lower surface of said susceptor to support the susceptor, one or more of said arms being tubular so that said sweep gas may be conducted through said tubular arms into said inlets.

17. An apparatus for processing a semiconductor wafer comprising:

a horizontal susceptor having a recess in an upper surface; and a blocker slightly smaller than an inner diameter of the recess to fit within the recess between a wafer and the susceptor at the outer periphery of the wafer, wherein said blocker is configured to create one or more gas passages between the susceptor and the wafer that permit sweep gas to flow radially outward from beneath the wafer while blocking deposition gas from flowing radially beneath the wafer.

18. The apparatus of claim 17, wherein said blocker is in the form of a ring and has an annular rib extending above a main body portion.

19. The apparatus of claim 18, wherein said ring has a plurality of circumferentially spaced feet depending from the main body portion.

20. The apparatus of claim 18, wherein said rib is centrally positioned between inner and outer diameters of the ring.

21. The apparatus of claim 18, wherein said rib is positioned adjacent an inner diameter of the ring.

22. The apparatus of claim 17, wherein said blocker has a plurality of upwardly extending lands which create said gas passages.

23. The apparatus of claim 22, wherein said blocker has a plurality of circumferentially spaced legs which create said gas passages.

24. The apparatus of claim 23, wherein said legs are circumferentially spaced from said lands.

25. The apparatus of claim 22, wherein said blocker is configured to support said wafer.

26. An apparatus for processing a semiconductor wafer comprising:

a blocker to be positioned on a susceptor and beneath the periphery of a wafer, said blocker having an upwardly extending rib, wherein the blocker has a plurality of circumferentially spaced feet depending from a main body portion.

27. An apparatus for processing a semiconductor wafer comprising a ring to be positioned on a susceptor and beneath the periphery of a semiconductor wafer, said ring having a plurality of circumferentially spaced lands extending upwardly from a main body portion.

28. The apparatus of claim 27, wherein said ring has a plurality of circumferentially spaced feet depending from the main body portion.

29. The apparatus of claim 28, wherein said feet are circumferentially offset from said lands.

* * * * *